(12) United States Patent
Dehe et al.

(10) Patent No.: US 9,745,188 B1
(45) Date of Patent: Aug. 29, 2017

(54) MICROELECTROMECHANICAL DEVICE AND METHOD FOR FORMING A MICROELECTROMECHANICAL DEVICE

(71) Applicant: Infineon Technologies AG, Neubiberg (DE)

(72) Inventors: Alfons Dehe, Reutlingen (DE); Stefan Barzen, Munich (DE); Ulrich Krumbein, Rosenheim (DE); Wolfgang Friza, Villach (AT); Wolfgang Klein, Zorneding (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/054,310

(22) Filed: Feb. 26, 2016

(51) Int. Cl.
*B81B 3/00* (2006.01)
*B81C 1/00* (2006.01)

(52) U.S. Cl.
CPC ........ *B81B 3/0072* (2013.01); *B81C 1/00325* (2013.01)

(58) Field of Classification Search
CPC ... B81B 3/0072; B81B 3/0013; B81B 3/0027; B81B 3/0086; B81C 1/00325
See application file for complete search history.

(56) References Cited

U.S. PATENT DOCUMENTS

| | | | |
|---|---|---|---|
| 6,522,762 B1 * | 2/2003 | Mullenborn | H04R 19/005 367/181 |
| 6,535,460 B2 | 3/2003 | Loeppert et al. | |
| 2002/0149071 A1 * | 10/2002 | Shim | H01H 59/0009 257/415 |
| 2007/0146095 A1 * | 6/2007 | Chou | H01H 1/5822 333/105 |
| 2009/0232336 A1 * | 9/2009 | Pahl | H04R 1/04 381/175 |
| 2012/0305374 A1 * | 12/2012 | Goossens | H01H 59/0009 200/181 |
| 2015/0041929 A1 * | 2/2015 | Bolognia | H04R 25/604 257/416 |

FOREIGN PATENT DOCUMENTS

EP        0561566 A2    9/1993

* cited by examiner

*Primary Examiner* — Yosef Gebreyesus
(74) *Attorney, Agent, or Firm* — Viering, Jentschura & Partner mbB

(57) ABSTRACT

A microelectromechanical device may include: a semiconductor carrier; a microelectromechanical element disposed in a position distant to the semiconductor carrier; wherein the microelectromechanical element is configured to generate or modify an electrical signal in response to a mechanical signal and/or is configured to generate or modify a mechanical signal in response to an electrical signal; at least one contact pad, which is electrically connected to the microelectromechanical element for transferring the electrical signal between the contact pad and the microelectromechanical element; and a connection structure which extends from the semiconductor carrier to the microelectromechanical element and mechanically couples the microelectromechanical element with the semiconductor carrier.

33 Claims, 22 Drawing Sheets

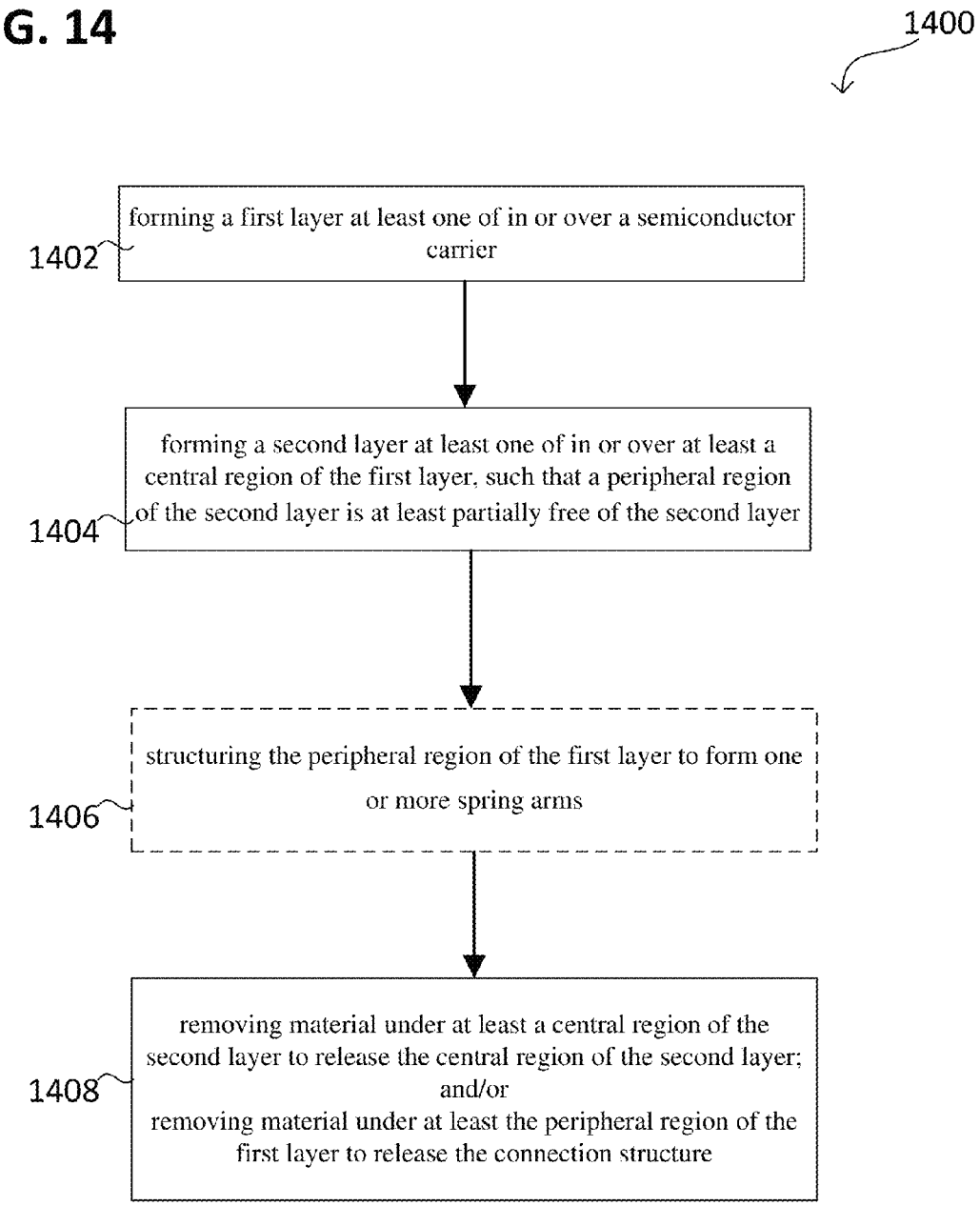

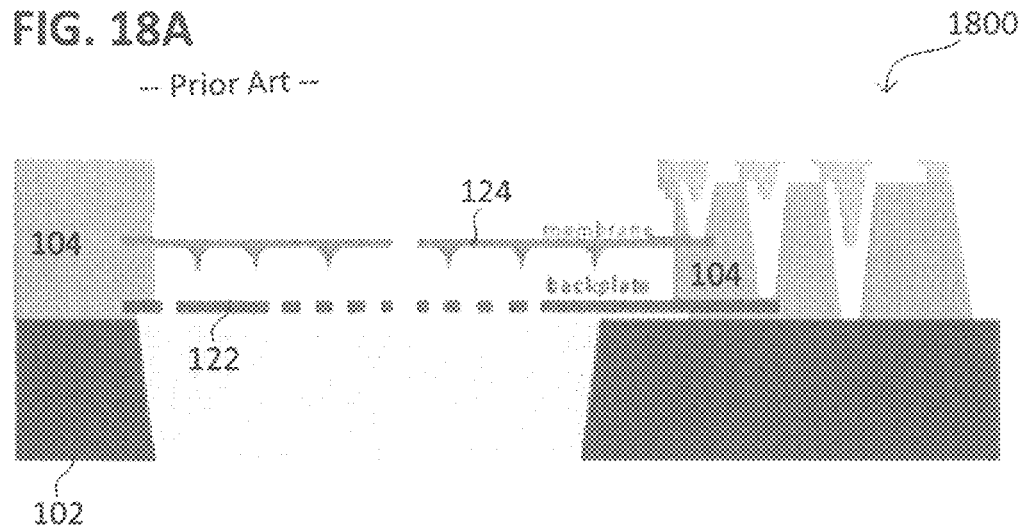
FIG. 18A
— Prior Art —
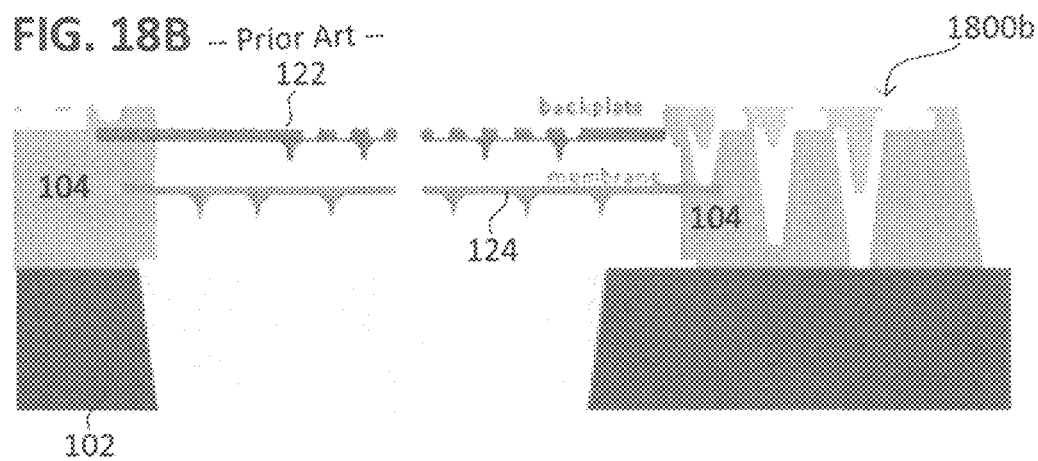
FIG. 18B — Prior Art —
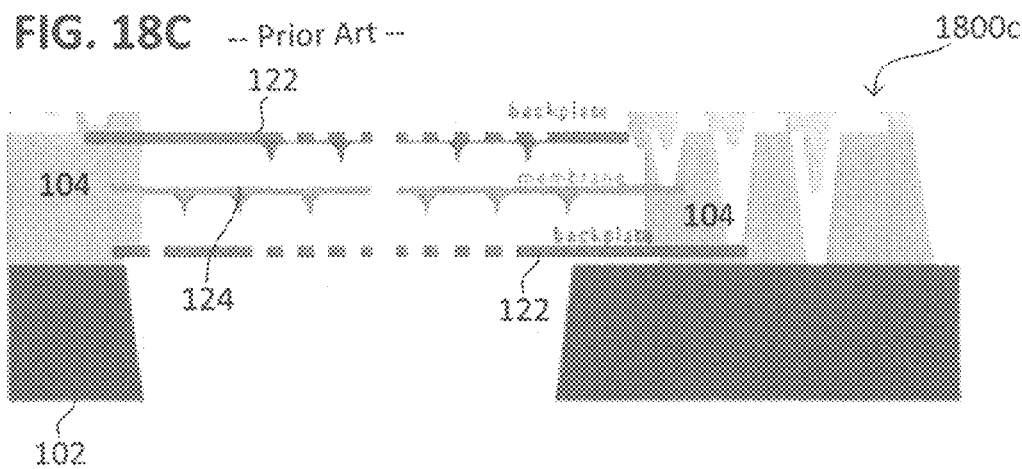
FIG. 18C — Prior Art —

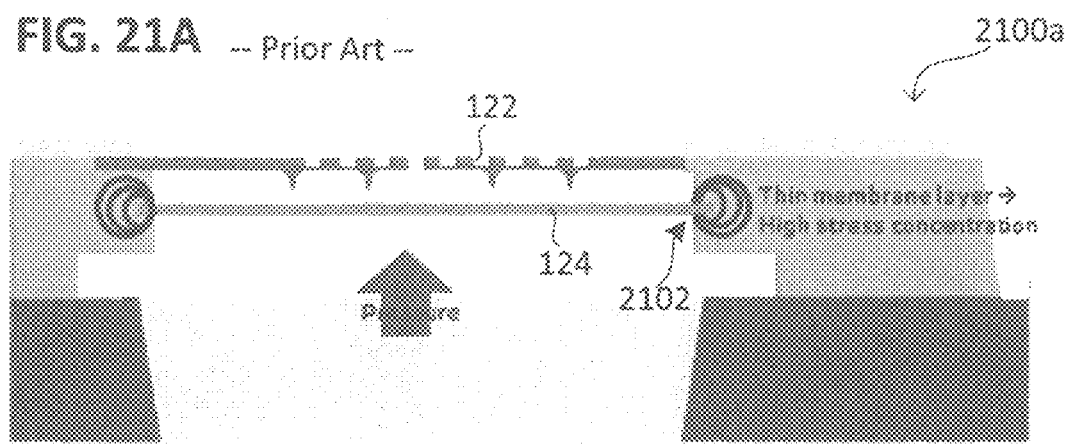
FIG. 21A — Prior Art —
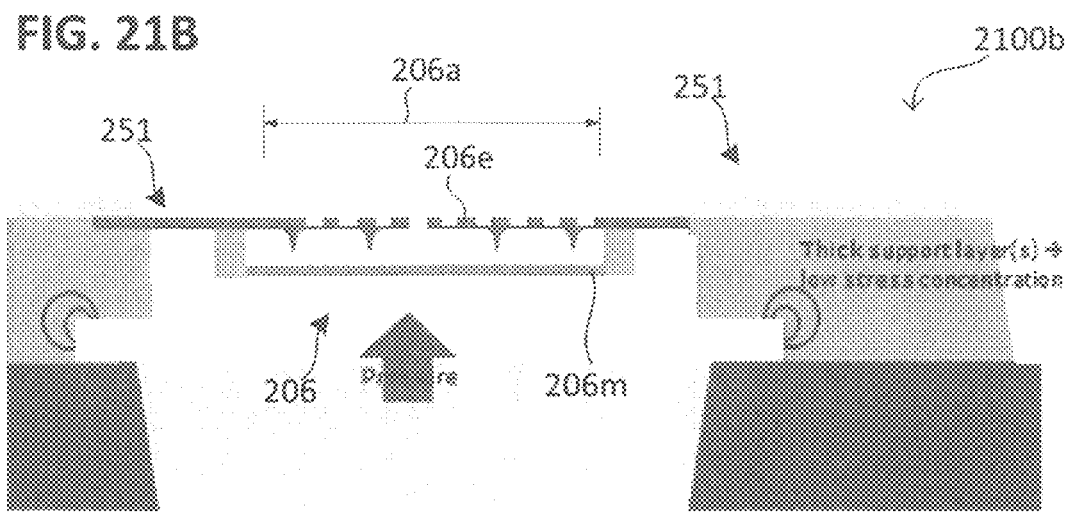
FIG. 21B

MICROELECTROMECHANICAL DEVICE AND METHOD FOR FORMING A MICROELECTROMECHANICAL DEVICE

TECHNICAL FIELD

Various embodiments relate generally to a microelectromechanical device and a method for forming a microelectromechanical device.

BACKGROUND

In general, a semiconductor chip (also called die, chip, or microchip) may be processed in semiconductor technology on and/or in a wafer (or a substrate or a carrier). The semiconductor chip may include one or more microelectromechanical systems (MEMS), which are formed during semiconductor technology processing.

During processing, the semiconductor chip may be mechanically stressed. For example, mechanical stress may occur during singulating the semiconductor chip from the wafer, during handling the semiconductor chip by positioning systems (also called Pick-and-Place applications), during thermally treating the semiconductor chip, e.g. during encapsulation or soldering the semiconductor chip. Alternatively or additionally, the semiconductor chip may be mechanically stressed during operation of the readily processed chip. For example, mechanical stress may occur due to thermal fluctuations during operating the chip.

Such mechanical stress (also referred as mechanical load) may be transferred to the microelectromechanical system on or in the semiconductor chip, which may lead to a deformation (also referred as strain) of the microelectromechanical system. The impact of mechanical stress on the microelectromechanical system (or a device operating the microelectromechanical system) may result in an uncontrolled or undefined behavior of the microelectromechanical system, e.g. malfunction or inaccurate function (e.g. measurement results), and/or may even damage the microelectromechanical system. For example, a microelectromechanical system and/or a device operating the microelectromechanical system (especially silicon microphones) is sensitive to stress from assembly or from thermal fluctuations. In other words, via assembly and the bulk of the substrate of the microelectromechanical systems and devices, the stress is coupling into the microelectromechanical system structure causing changes in their structure and their sensitivity. After assembly, the deformation of the microelectromechanical system may remain, which complicates the fabrication of accurate working devices.

Conventionally, chips with microelectromechanical systems are stress decoupled using a compliant chip attach, e.g. silicone glue. This is possible for assembling chips on printed circuit boards (PCB) but is limited in decoupling capabilities and is difficult to transfer to other assembling techniques. Especially, microelectromechanical systems with high sensitivity are affected by the stress arising from assembly.

SUMMARY

A microelectromechanical device may include: a semiconductor carrier; a microelectromechanical element disposed in a position distant to the semiconductor carrier; wherein the microelectromechanical element is configured to generate or modify an electrical signal in response to a mechanical signal and/or is configured to generate or modify a mechanical signal in response to an electrical signal; at least one contact pad, which is electrically connected to the microelectromechanical element for transferring the electrical signal between the contact pad and the microelectromechanical element; and a connection structure which extends from the semiconductor carrier to the microelectromechanical element and mechanically couples the microelectromechanical element with the semiconductor carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 13 and FIG. 14 respectively show a method for forming a microelectromechanical device in a schematic flow diagram;

FIG. 18A, FIG. 18B and FIG. 18C respectively show a conventional microelectromechanical device in a schematic cross sectional view;

FIG. 21A shows a conventional microelectromechanical device in a schematic cross sectional view;

FIG. 21B shows a microelectromechanical device according to various embodiments in a schematic cross sectional view;

DESCRIPTION

Figure 1A:
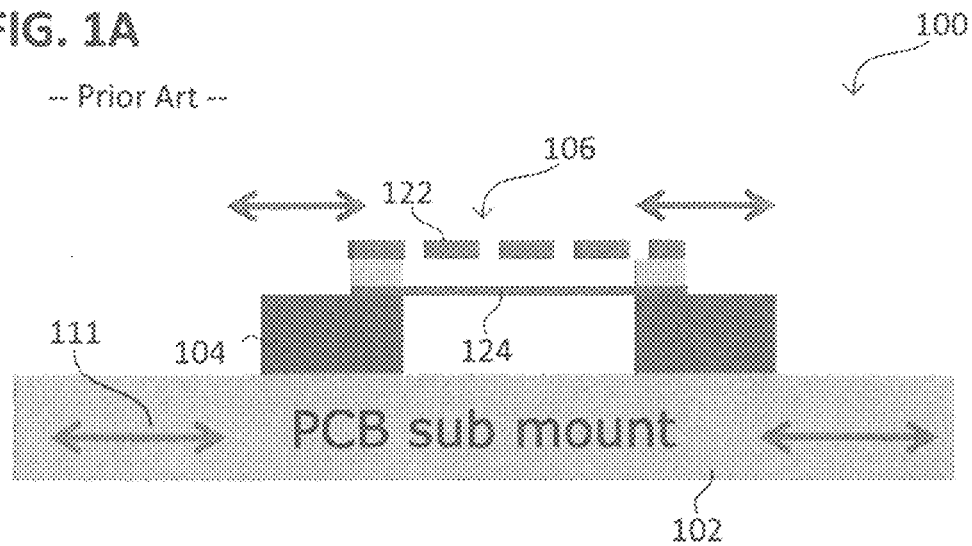
FIG. 1A, FIG. 1B and FIG. 1C respectively show a conventional microelectromechanical device in a schematic cross sectional view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface (illustratively, on the top side) of the substrate (or the main processing surface of the carrier or wafer). Further, the term "width" used with regards to a "width" of a structure (or of a structure element) may be used herein to mean the lateral extension of a structure. Further, the term "height" or "depth" used with regards to a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

The term "forming" with regards to a layer, a material or a region may refer to disposing, arranging or depositing the layer, the material or the region. A method for forming, e.g. a layer, a material, a region, etc., may include various deposition methods which among others may be: chemical vapor deposition, physical vapor deposition (e.g. for dielectric materials), electrodeposition (also called electroplating, e.g. for metals or metal alloys) or spin coating (e.g. for fluid materials). Generally, a vapor deposition may be performed by sputtering, laser ablation, cathodic arc vaporization or thermal evaporation. A method for forming metals may include metal plating, e.g. electroplating or chemical plating.

The term "forming" with regards to a layer, a material or a region may also include a chemical reaction or fabricating a chemical composition, where e.g. at least a portion of the layer, the material or the region is formed by a transformation of one set of chemical substances into the chemical composition. "Forming" may for example include changing the positions of electrons by breaking or forming chemical bonds between atoms of the set of chemical substances. The term "Forming" may further include oxidation and reduction, complexation, precipitation, an acid-base reaction, a solid-state reaction, substitution or doping, addition and elimination, diffusion or a photochemical reaction. "Forming" may, for example, change the chemical and physical properties of the set of chemical substances which chemically compose the portion of the layer, the material or the region which may be among others electrical conductivity, phase composition, optical properties, etc. "Forming" may for example include the application of a chemical reagent to a mother compound to change the chemical and physical properties of the mother compound.

The term "structuring" with regards to a layer, a material or a region may refer to form a structure (e.g. a desired shape or a desired pattern) into or from the layer, the material or the region. To structure the layer, the material or the region, material may be removed from the layer, the material or the region, e.g. using etching. To remove material from the layer, the material or the region a mask (providing a pattern) may be used, e.g. a mask that provides to remove material (e.g. to etch a structure) according to the pattern of the mask from the layer, the material or the region. Illustratively, the mask may prevent regions (which are designated to remain) from being removed (e.g. by etching). Alternatively or additionally, to structure the layer, the material or the region material may be disposed using a mask (providing a pattern). The mask may provide to form (e.g. dispose) material according to the pattern of the mask. Illustratively, the mask may prevent regions (which are designated to remain free) from being covered by the layer or the material.

In general, removing material may include etching the material. The term "etching" may include various etching procedures, e.g. chemical etching (e.g. wet etching or dry etching), physical etching, plasma etching, ion etching etc. For etching a layer, a material or a region an etchant may be applied to the layer, the material or the region. For example, the etchant may react with the layer, the material or the region forming a substance (or chemical compound) which can be easily removed, e.g. a volatile substance. Alternatively or additionally, the etchant may for example, atomize the layer, the material or the region.

The mask may be a temporal mask, which may be removed after etching (e.g. formed from a resin or a metal) or the mask may be a permanent mask (e.g. a mask-blade), which may be used several times. A temporal mask may be formed e.g. using a photomask.

According to various embodiments, the microelectromechanical device may be formed as or may include a semiconductor chip. For example, the semiconductor chip may include the microelectromechanical element (may also be referred as microelectromechanical system). In other words, the microelectromechanical element may be implemented into (e.g. part of) a semiconductor chip, e.g. at least partially monolithically. The semiconductor chip (also called chip, die, or microchip) may be processed in semiconductor technology on and/or in a wafer (or a substrate or a carrier). The semiconductor chip may include one or more microelectromechanical systems (MEMS), which are formed during semiconductor technology processing. In this case, the semiconductor carrier may be part of the semiconductor chip, e.g. the semiconductor carrier may be part of or may form the so-called semiconductor body of the chip. Optionally, the microelectromechanical element may be part of or may be electrically coupled to an integrated circuit on the chip.

According to various embodiments, a semiconductor carrier (e.g. of a microelectromechanical device, e.g. the semiconductor carrier of a semiconductor chip) may be singulated from a wafer by removing material from a kerf region of the wafer (also called dicing or cutting the wafer). For example, removing material from the kerf region of the wafer may be processed by scribing and breaking, cleavage, blade dicing or mechanical sawing (e.g. using a dicing saw). In other words, the semiconductor carrier may be singulated by a wafer dicing process. After the wafer dicing process the semiconductor carrier (or the finished microelectromechanical device) may be electrically contacted and encapsulated, e.g. by mold materials, into a chip carrier (also called a chip housing) which may then be suitable for use in electronic devices such as gauges. For example, the semiconductor chip may be bonded to a chip carrier by wires. Further, the semiconductor chip (e.g. bonded to a chip carrier) may be mounted (e.g. soldered) onto a printed circuit board.

According to various embodiments, a semiconductor carrier (e.g. of a microelectromechanical device, e.g. the semiconductor carrier of a semiconductor chip) may include or may be made of (in other words formed from) semiconductor materials of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, the semiconductor carrier is made of silicon (doped or undoped). In an alternative embodiment, the semiconductor carrier is a silicon on insulator (SOI) wafer. As an alternative, any other suitable semiconductor material may be used for the semiconductor carrier, for example semiconductor compound material such as gallium phosphide (GaP), indium phosphide (InP), but also any suitable ternary semiconductor compound material or quaternary semiconductor compound material such as indium gallium arsenide (InGaAs).

According to various embodiments, a semiconductor carrier (e.g. of a microelectromechanical device, e.g. the semiconductor carrier of a semiconductor chip) may be covered with a passivation layer for protecting the semiconductor carrier from environmental influences, e.g. oxidation. The passivation layer may include a metal oxide, an oxide of the semiconductor carrier (also referred as substrate or semiconductor body), e.g. silicon oxide, a nitride, e.g. silicon nitride, a polymer, e.g. benzocyclobutene (BCB) or polyimide (PI), a resin, a resist, or a dielectric material.

According to various embodiments, an electrical conducting material may include or may be formed from a metal, a metal alloy, an intermetallic compound, a silicide (e.g. titanium silicide, molybdenum silicide, tantalum silicide or tungsten silicide), a conductive polymer, a polycrystalline semiconductor, or a highly doped semiconductor, e.g. polycrystalline silicon (also called polysilicon) or a highly doped silicon. An electrical conducting material may be understood as material with moderate electrical conductivity, e.g. with an electrical conductivity (measured at room temperature and constant electric field direction) larger than about 10 S/m, e.g. larger than about $10^2$ S/m, or with high electrical conductivity, e.g. larger than about $10^4$ S/m, e.g. larger than about $10^6$ S/m.

According to various embodiments, a metal may include or may be formed from at least one element of the following group of elements: aluminum, copper, nickel, magnesium, chromium, iron, zinc, tin, gold, silver, iridium, platinum or titanium. Alternatively or additionally, a metal may include or may be formed from, a metal alloy including one element or more than one element of the group of elements. For example a metal alloy may include an intermetallic compound, e.g. an intermetallic compound of gold and aluminum, an intermetallic compound of copper and aluminum, an intermetallic compound of copper and zinc (e.g. "brass") or an intermetallic compound of copper and tin (e.g. "bronze").

According to various embodiments, an electrically insulating material, e.g. a dielectric material, may be understood as material with poor electrical conductivity, e.g. with an electrical conductivity (measured at room temperature and constant electric field direction) smaller than about $10^{-2}$ S/m, e.g. smaller than about $10^{-5}$ S/m, e.g. smaller than about $10^{-7}$ S/m.

According to various embodiments, an insulating material may include a semiconductor oxide, a metal oxide, a ceramic, a semiconductor nitride, a metal nitride, a semiconductor carbide, a metal carbide, a glass, e.g. fluorosilicate glass (FSG), a dielectric polymer, a silicate, e.g. hafnium silicate or zirconium silicate, a transition metal oxide, e.g. hafnium dioxide or zirconium dioxide, an oxynitride, e.g. silicon oxynitride, or any other dielectric material types. An insulating material may withstand an electric field without breaking down (in other words without experiencing failure of its insulating properties, e.g. without substantially changing its electrical conductivity).

According to various embodiments, a microelectromechanical element may be understood as a component, which is able to generate or modify an electrical signal in response to a mechanical signal and/or is configured to generate or modify a mechanical signal in response to an electrical signal. In general, and microelectromechanical element may be configured to transfer mechanical energy into electrical energy and/or electrical energy into mechanical energy. In other words, a microelectromechanical element may work as a transducer, which is configured to transduce mechanical energy into electrical energy and/or to transduce electrical energy into mechanical energy. A microelectromechanical element may have a size in the range from about a few micrometers (μm) to about a few millimeters (mm), e.g. in the range from about a 10 μm to about 5 mm, e.g. in the range from about a 100 μm to about 2 mm, e.g. about 1 mm or Alternatively, smaller than about 1 mm, e.g. smaller than 500 μm, e.g. smaller than 100 μm. A microelectromechanical element according to various embodiments may be processed in semiconductor technology.

A microelectromechanical element according to various embodiments may be used as a sensor (micro sensor) for sensing a mechanical signal and to generate an electrical signal, which represents the mechanical signal. Alternatively, a microelectromechanical element maybe used as an actuator for generating mechanical signal based on the electrical signal supported to the microelectromechanical element. For example, the microelectromechanical element may be used as microphone or as speaker.

Figure 1B:
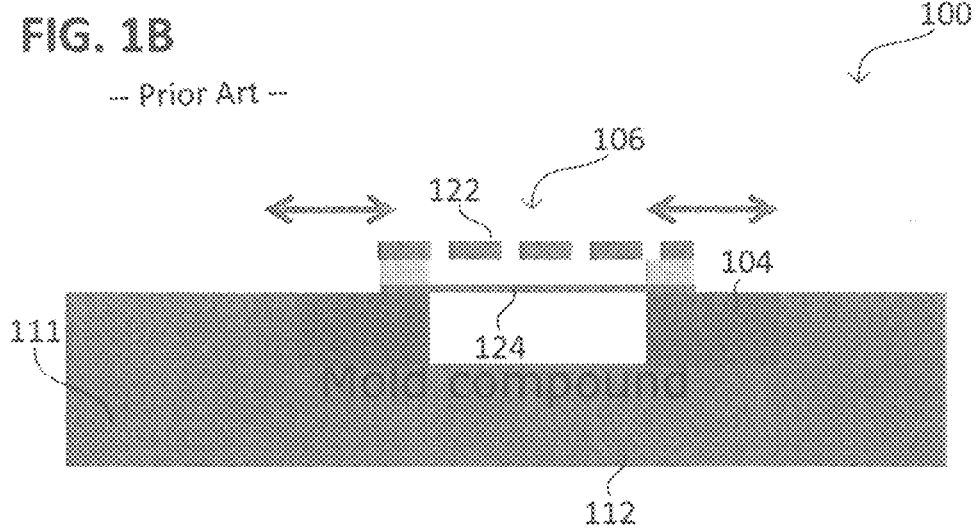
Figure 1C:
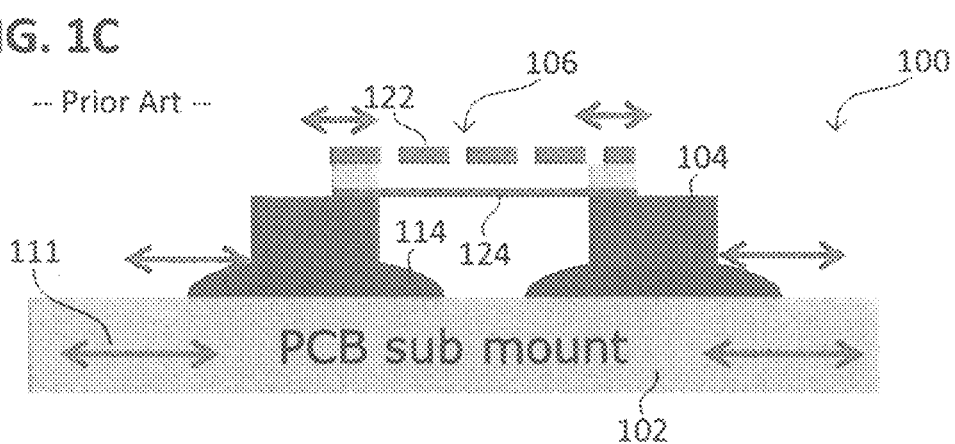

FIG. 1A, FIG. 1B and FIG. 1C respectively illustrate a conventional microelectromechanical device 100. The microelectromechanical devices 100 (also referred as microelectromechanical system devices) may be affected by strain 111. For example, strain 111 (mechanical strain) may be induced by a printed circuit board 102 which carries semiconductor carrier 104, e.g. the microelectromechanical element 106 (see FIG. 1A), and transferred by the semiconductor carrier 104 into the microelectromechanical element 106. Alternatively, strain 111 (mechanical strain) may be transferred through a mold compound 112 (which may be part of a chip carrier) which carries the microelectromechanical element 106 (see FIG. 1B) into the semiconductor carrier 104 and into the microelectromechanical element 106.

Conventionally, to reduce the transfer of strain into the microelectromechanical element 106, the semiconductor carrier including the microelectromechanical element (also referred as MEMS die) is decoupled by compliant die attach 114, e.g. silicone glue. This variant is limited to the usage in combination with a PCB 102 assembly, and is Further, limited in decoupling capabilities. Further, microelectromechanical elements 106 with high sensitivities will still be affected by the stress which is transferred by the mounting, e.g. from the PCB 102. Via the assembly and the bulk of the substrate (e.g. the semiconductor carrier 104) of the MEMS device 100 the stress is coupled into the microelectromechanical element 106 (MEMS element) causing changes in stress and sensitivity of the microelectromechanical element 106.

Figure 2A:
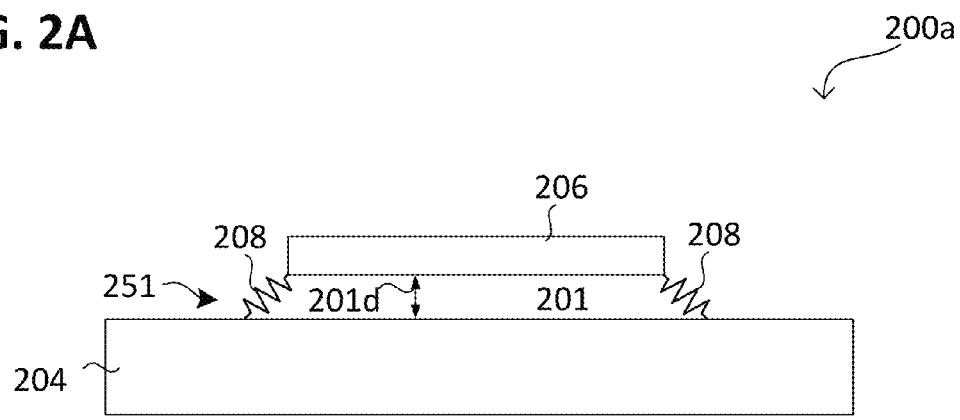
FIG. 2A, FIG. 2B and FIG. 2C respectively show a microelectromechanical device according to various embodiments in a schematic cross sectional view.

FIG. 2A illustrates a microelectromechanical device 200*a* according to various embodiments. The microelectromechanical device 200*a* may include a semiconductor carrier 204 and a microelectromechanical element 206.

The microelectromechanical element may be disposed at least one of over or in the semiconductor carrier 204 in a distance to the semiconductor carrier 204, e.g. such that a gap 201 is formed between the microelectromechanical element 206 and the semiconductor carrier 204. For example, the microelectromechanical element 206 may be disposed in the distance 201*d* regarding a surface of the semiconductor carrier 204. The distance 201*d* between the microelectromechanical element 206 and the semiconductor carrier 204 may be in the range from about a few nanometers (nm) to about hundreds of micrometers (μm), e.g. in the range from about a 5 nm to about 500 μm, e.g. in the range from about a 10 nm to about 100 μm, e.g. in the range from about a 100 nm to about 10 μm.

Further, the microelectromechanical device 200*a* may include a connection structure 251. The connection structure 251 may include or be formed from one or more spring arms 208, e.g. two spring arms 208 as exemplarily illustrated in FIG. 2A. The connection structure 251 (e.g. the one or more spring arms 208) may define a mean position of the microelectromechanical element 206 relative to the semiconductor 204. The mean position may define the distance 201*d* of the microelectromechanical element 206 to the semiconductor carrier 204, as described before.

The connection structure 251 (e.g. the one or more spring arms 208) may elastically couple (resiliently support) the microelectromechanical element 206 with the semiconductor carrier 204. For example, the connection structure 251 may extend through the gap and elastically couple the microelectromechanical element with the semiconductor carrier. An elastic coupling (which may also be referred as to a flexible coupling) may be understood as a coupling which is able to return to the original configuration (e.g. a shape or position) by itself after deformation (e.g. by bending, stretching, or compression), or deflection (e.g. displacement or distortion).

For example, the connection structure 251 (e.g. the one or more spring arms 208) may be configured to generate a force (illustratively, a spring force) pointing to the mean position in response to a displacement of the microelectromechanical element 206 from the mean position. In other words the connection structure 251 (e.g. the one or more spring arms 208) may drive the microelectromechanical element 206 into a defined position distant to the semiconductor carrier 204, e.g. resiliently, in other words returning to the mean position, if displaced from the mean position.

This coupling, the elastic coupling, limits the transfer the mechanical stress, e.g. mechanical load between the microelectromechanical element 206 and the semiconductor carrier 204. In other words, the connection structure 251 (e.g. the one or more spring arms 208) may resiliently couple the microelectromechanical element 206 and the semiconductor carrier 204. The connection structure 251 (e.g. the one or more spring arms 208) may absorb the mechanical stress at least partially, e.g. by elastically absorbing a force.

Optionally, the microelectromechanical device 200*a* may Further, include at least one contact pad (not illustrated), which is electrically connected to the microelectromechanical element 204 for transferring an electrical signal between the contact pad and the microelectromechanical element 204. The at least one contact pad may be disposed on the semiconductor carrier 204 and/or on the microelectromechanical element 204. For example an electrically conductive layer (e.g. a metallization) may be formed at least one of in or over the semiconductor carrier 204, wherein the electrically conductive layer may include the at least one contact pad. The electrically conductive layer may further include one or more electrically conducting lines (also referred to as electrical conducting tracks), which connect the at least one contact pad with the microelectromechanical element 206, e.g. via the connection structure 251.

Figure 2B:
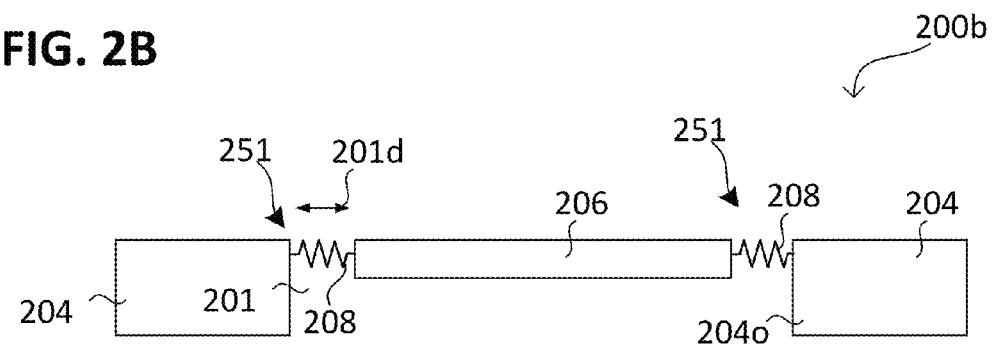

FIG. 2B illustrates a microelectromechanical device 200b according to various embodiments. The microelectromechanical device 200b may be similar to the microelectromechanical device 200a. In the case of the microelectromechanical device 200b, as illustrated in FIG. 2B, the semiconductor carrier 204 may include an opening 204o, e.g. a hole, e.g. extending through (the thickness of) the semiconductor carrier 204 (also referred as a through hole). The microelectromechanical element 206 may be disposed at least one of in or over the opening 204o, such that a gap 201 is formed between the microelectromechanical element 206 and the semiconductor carrier 204. The gap 201 may have a width 201d, which defines the distance between the microelectromechanical element 206 and the semiconductor carrier 204. The gap may extend substantially around the microelectromechanical element 206 in a lateral direction.

According to various embodiments, the connection structure 251 (e.g. the one or more spring arms 208) may extend laterally, such that they may at least provide an elastic coupling between the microelectromechanical element 206 and the semiconductor carrier 204. In other words, the connection structure 251 (e.g. the one or more spring arms 208) and the microelectromechanical element may extend along one plane (laterally).

Figure 2C:
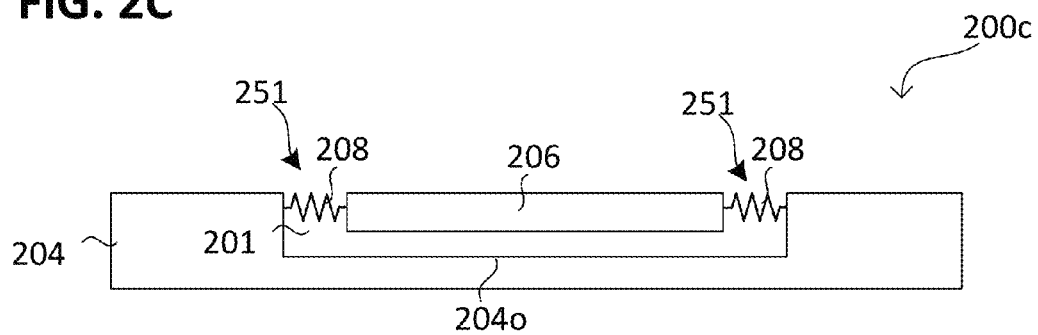

FIG. 2C illustrates a microelectromechanical device 200c according to various embodiments. The microelectromechanical device 200c may be similar to the microelectromechanical device 200a. In the case of the microelectromechanical device 200c, the semiconductor carrier 204 may include an opening 204o, e.g. a recess. The microelectromechanical element 206 may be disposed at least one of in or over the opening 204o, such that a gap 201 is formed between the microelectromechanical element 206 and the semiconductor carrier 204. The gap 201 may have a width 201d, which defines the distance between the microelectromechanical element 206 and the semiconductor carrier 204. The gap 201 may extend substantially around the microelectromechanical element 206 in a lateral direction and the gap may extend under the microelectromechanical element 206 (in other words in a vertical direction).

Figure 3A:
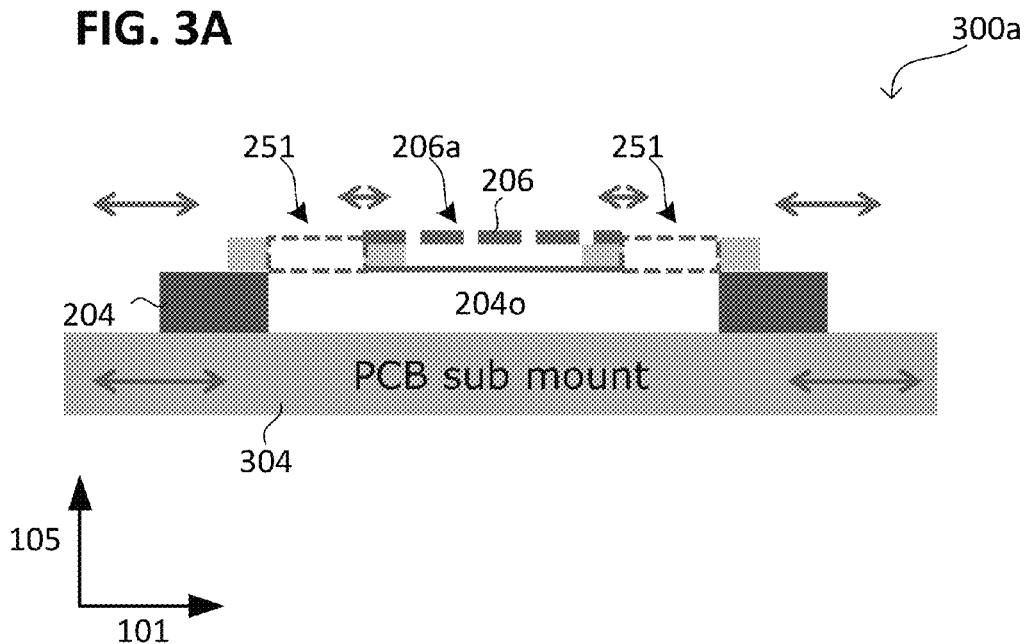
FIG. 3A and FIG. 3B respectively show a microelectromechanical device according to various embodiments in a schematic cross sectional view.

FIG. 3A illustrates a microelectromechanical device 300a according to various embodiments. The semiconductor carrier 204 may be mounted at least one of in or over a PCB 304. For example, the semiconductor carrier 204 may be in physical contact to or with the PCB 304 or may at least be coupled rigidly to the PCB, e.g. via glue or solder. The PCB may include one or more electrically conductive layers (e.g. copper layer), e.g. one or more redistribution layers, which are adhered (in other words laminated) to each other by a polymer material, e.g. by a mold material (mold compound). The electrically conductive layers may form a plurality of conductive tracks (electrically conducting lines) or a plurality of contact pads. According to various embodiments, the at least one contact pad of the microelectromechanical device 300a may be part of the plurality of contact pads of the PCB 304.

According to various embodiments, at least one first contact pad of the microelectromechanical device 300a may be disposed or formed at least one of over or in the semiconductor carrier 204. At least one second contact pad of the microelectromechanical device 300a may be disposed or formed at least one of over or in the PCB 304 (e.g. being a part of the plurality of contact pads of the PCB 304). The at least one first contact pad and the at least one second contact pad may be electrically connected to each other, e.g. by a wire bond connection. For example, each contact pad of the microelectromechanical device 300a which is disposed or formed over or in the semiconductor carrier 204 may be electrically connected to at least one contact pad of the microelectromechanical device 300a which is disposed or formed over or in the PCB 304 (e.g. to at least one contact pad of the plurality of contact pads of the PCB 304). In other words, the at least one contact pad of the microelectromechanical device 300a may include at least two contact pads, which are electrically connected to each other, e.g. by a wire bond connection.

The microelectromechanical device 300a provides, if the PCB 304 is mechanically strained, e.g. by mechanical load or e.g. by thermal load, mechanical stress is transferred through the semiconductor carrier 204 to the connection structure 251 (e.g. the one or more spring arms 208). The connection structure 251 (e.g. the one or more spring arms 208) may be deflect to absorb the mechanical stress at least partially (that means partially or completely), such that the stress, which is transferred to the microelectromechanical element 204 is reduced, e.g. such that mechanical load is transferred (only) partially between the semiconductor carrier 204 and the microelectromechanical element 206. Alternatively, the stress, which is transferred to the microelectromechanical element 204 may be substantially eliminated.

According to various embodiments, the connection structure 251 (e.g. the one or more spring arms 208) may extend laterally, such that the connection structure 251 may at least provide an elastic coupling between the microelectromechanical element 206 and the semiconductor carrier 204. The connection structure 251 (e.g. the one or more spring arms 208) may be configured to have a lateral stiffness smaller than a vertical stiffness. The lateral stiffness may be smaller than the vertical stiffness, e.g. the lateral stiffness may be smaller than about 50% of the vertical stiffness, e.g. smaller than about 10% of the vertical stiffness, e.g. the lateral stiffness may be in a range from about 10% to about 30% of the vertical stiffness. Therefore, the connection structure 251 (e.g. the one or more spring arms 208) may have an extension in lateral direction (illustratively, their width), which is smaller than in vertical direction (illustratively, their thickness). For example, the thickness of the connection structure 251 (e.g. the one or more spring arms 208, e.g. every spring arm 208 of the one or more spring arms 208) may be larger than about 150% of the width of the connection structure 251 (e.g. of the one or more spring arms 208), e.g. larger than about 200% (larger than about two times the width of the connection structure 251 (e.g. the one or more spring arms 208)), e.g. larger than about 300%, e.g. larger than about 400%, e.g. larger than about 500%, e.g. larger than about 600%, e.g. larger than about 700%, e.g. larger than about 800%, e.g. larger than about 900%, e.g. larger than about 1000% (ten times).

Along a first direction (e.g. a lateral direction) a stiffness (e.g. a lateral stiffness, in other words, an in-plane stiffness) of the connection structure 251 (e.g. the one or more spring arms 208, e.g. every spring arm 208 of the one or more spring arms 208) may be less than a stiffness (e.g. a lateral stiffness) of at least one of: the microelectromechanical element and the semiconductor carrier; e.g. less than about 50% (e.g. less than about 40%, less than about 30%, less than about 20%, or less than about 10%) of the stiffness (e.g. the lateral stiffness) of at least one of: the microelectromechanical element and the semiconductor carrier.

Along a second direction (e.g. a vertical direction) a stiffness (e.g. a vertical stiffness, in other words, an out-of-plane stiffness) of the connection structure is more than a stiffness (e.g. a vertical stiffness) of at least one of: the microelectromechanical element and a membrane of the microelectromechanical element, e.g. more than about 100% (e.g. more than about 200%, more than about 300%, more than about 500%, or more than about 1000%) of the stiffness (e.g. the vertical stiffness) of at least one of: the microelectromechanical element and the semiconductor carrier. The first direction (e.g. direction 101, see FIG. 11B) may be perpendicular to the second direction (e.g. direction 105, see FIG. 11B).

Alternatively or additionally, along a third direction (e.g. a further lateral direction) a stiffness (e.g. a further lateral stiffness, in other words, an further in-plane stiffness) of the connection structure 251 (e.g. the one or more spring arms 208, e.g. every spring arm 208 of the one or more spring arms 208) may be less than a stiffness (e.g. a further lateral stiffness) of at least one of: the microelectromechanical element and the semiconductor carrier; e.g. less than about 50% (e.g. less than about 40%, less than about 30%, less than about 20%, or less than about 10%) of the stiffness (e.g. the further lateral stiffness) of at least one of: the microelectromechanical element and the semiconductor carrier. The third direction may be perpendicular to at least one of the first direction and the second direction (in other words, the third direction may be perpendicular to at least one of the first direction and/or the second direction). The first direction and the third direction (e.g. direction 103, see FIG. 11B) may define a plane (in other words, they may be in-plane). The second direction may be perpendicular to the plane (in other words, it may be out-of-plane). For example, the microelectromechanical element 206, for example, the membrane (e.g. in case of the microelectromechanical element 206 including a microphone), may be extended into at least one of the first direction and the third direction (e.g. defining the plane).

In other words, the connection structure 251 (e.g. the one or more spring arms 208) may generate a first spring force in a lateral direction (lateral force), if the microelectromechanical element 206 is moved in a lateral direction (e.g. direction 101) and or if mechanical strain is applied in a lateral direction, and the connection structure 251 (e.g. the one or more spring arms 208) may generate a second spring force in a vertical direction (vertical force), if the microelectromechanical element 206 is moved in a vertical direction (e.g. direction 105) and or if mechanical strain is applied in a vertical direction (e.g. due to torsion of the PCB 304). The lateral force may be smaller than the vertical force, e.g. the lateral force may be smaller than about 50% of the vertical force, e.g. smaller than about 10% of the vertical force. That means that the connection structure 251 (e.g. the one or more spring arms 208) have an anisotropic stiffness, wherein a value of the anisotropic stiffness in a lateral direction is smaller than a value of the anisotropic stiffness in a vertical direction.

According to various embodiments, the lateral stiffness may be in a range from about 1 N/m to about 500 N/m, e.g. in a range from about 1 N/m to about 200 N/m, e.g. in a range from about 1 N/m to about 100 N/m, e.g. in a range from about 1 N/m to about 50 N/m or in a range from about 50 N/m to about 200 N/m. According to various embodiments, the vertical stiffness may be in a range from about 100 N/m to about 50000 N/m, e.g. in a range from about 200 N/m to about 50000 N/m, e.g. in a range from about 500 N/m to about 50000 N/m, e.g. in a range from about 1000 N/m to about 50000 N/m, e.g. in a range from about 5000 N/m to about 50000 N/m, e.g. in a range from about 10000 N/m to about 50000 N/m.

To provide the elastic coupling, the connection structure 251 may be opened, e.g. to provide the one or more spring arms 208. The connection structure 251 (e.g. the one or more spring arms 208) may be at least one of: curved, angled, branched, or duple-angled into a lateral direction (see also FIG. 11B). In other words, the connection structure 251 (e.g. the one or more spring arms 208) may have a curvature or angle, which is directed into a lateral direction (in other words the tangent of the curvature or angle points into a lateral direction). In this case, the curvature or angle of the one or more spring arms 208 may be changed (e.g. increased or reduced) to absorb mechanical strain. In other words, the connection structure 251 (e.g. the one or more spring arms 208) may deflect to absorb mechanical strain.

Figure 3B:
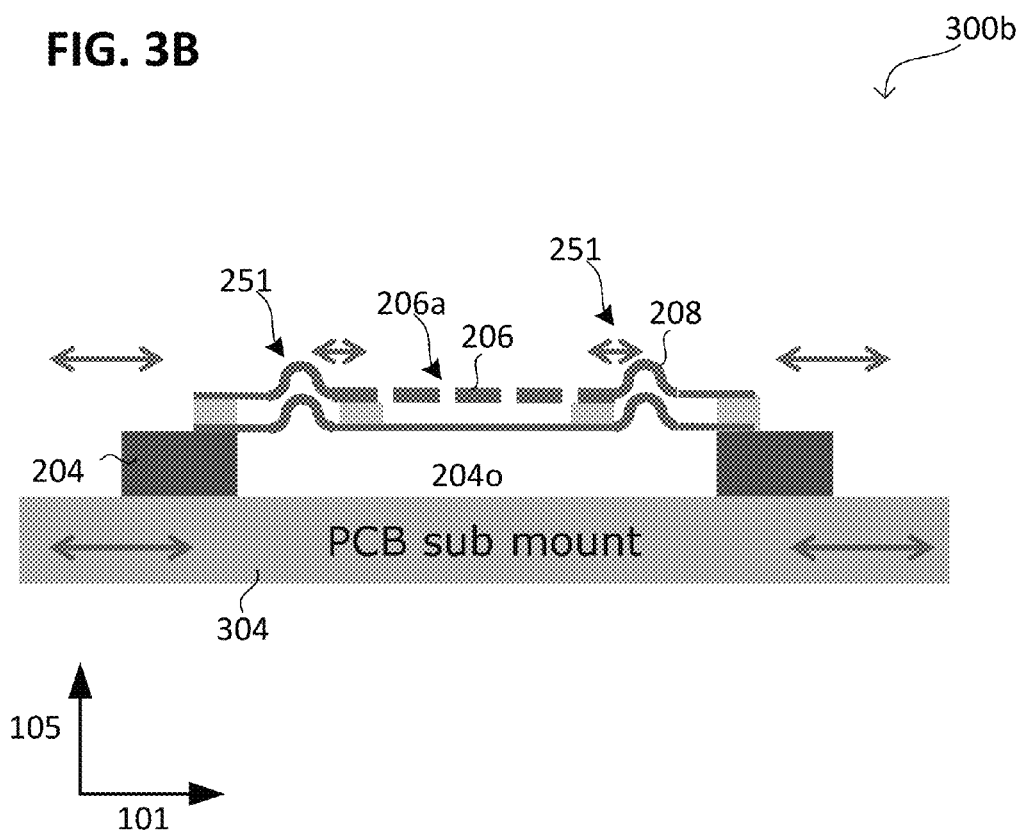

FIG. 3B illustrates a microelectromechanical device 300b according to various embodiments. The microelectromechanical device 300b may include a connection structure 251 (e.g. the one or more spring arms 208), which is corrugated, e.g. curved into a vertical direction. In this case, the connection structure 251 (e.g. the one or more spring arms 208) may have an anisotropic stiffness, wherein a value of the anisotropic stiffness in a lateral direction is smaller than a value of the anisotropic stiffness in a vertical direction. This enables to absorb more mechanical strain in a vertical direction, e.g. when a torque is applied to the PCB 304. For example, a higher sensitivity of the microelectromechanical element 206 to vibration may be provided, e.g. to vibration and acoustic response.

To provide the elastic coupling, the connection structure 251 (e.g. the one or more spring arms 208) may be curved, angled or double-angled into a vertical direction. In other words, the connection structure 251 (e.g. the one or more spring arms 208) may have a curvature or angle, which is directed into a vertical direction (in other words the tangent of the curvature or angle points into a vertical direction).

Figure 4A:
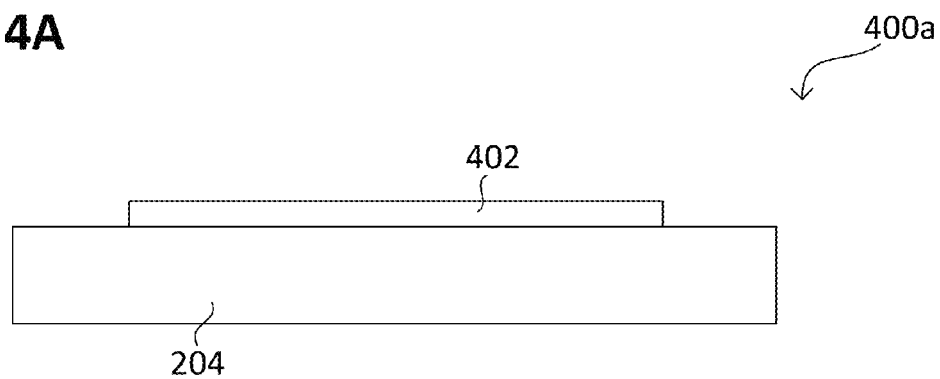
FIG. 4A, FIG. 4B and FIG. 4C respectively show a microelectromechanical device according to various embodiments in a method for forming a microelectromechanical device according to various embodiments in a schematic cross sectional view.
Figure 4B:
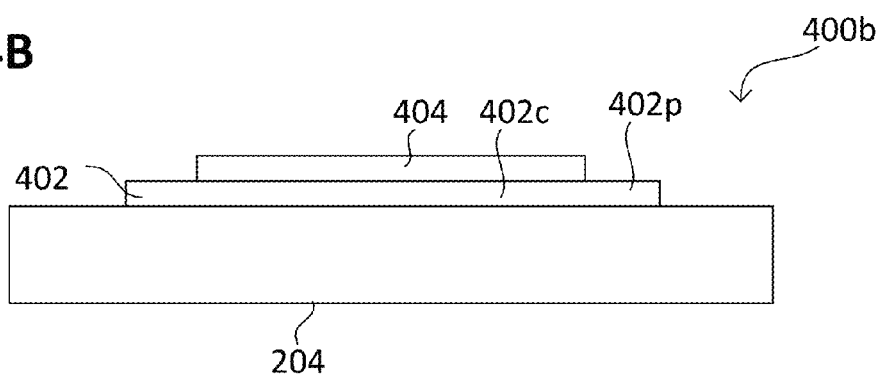
Figure 4C:
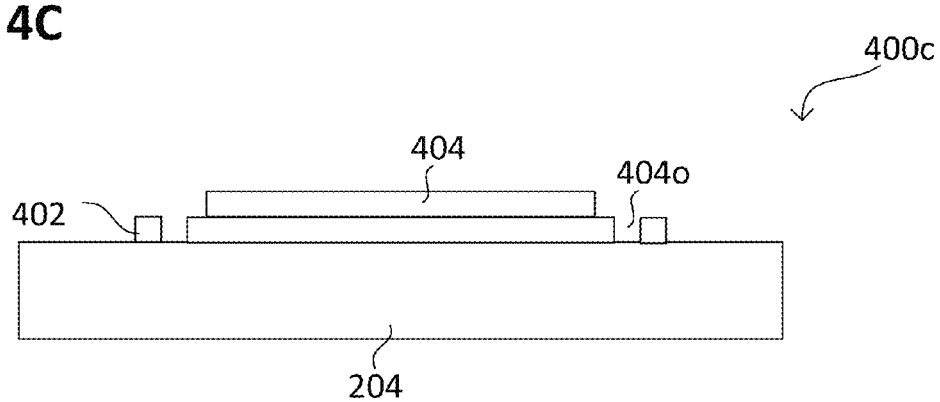

FIG. 4A, FIG. 4B and FIG. 4C respectively illustrate a microelectromechanical device 400a, 400b, 400c according to various embodiments in a method for forming a microelectromechanical device according to various embodiments.

According to various embodiments, a first layer 402 may be formed at least one of in or over a semiconductor carrier 204, as illustrated in FIG. 4A. The semiconductor carrier 204 may be a part of a semiconductor chip or a part of a wafer (before singulating the wafer), or part of a wafer (after singulating the wafer), e.g. embedded into mold material, e.g. as part of a wafer level package.

The first layer 402 may include or may be formed from a semiconducting material (e.g. silicon, e.g. polycrystalline silicon) or may include or may be formed from an electrical conducting material. Alternatively or additionally, the first layer 402 may include or may be formed from a metal, e.g. copper or aluminum. For example, the first layer 402 may include one or more sublayers, wherein the sublayers may include different materials.

According to various embodiments, a second layer 404 may be formed at least one of in or over the first layer 402, as illustrated in FIG. 4B. The second layer 402 may be formed at least one of in or over at least a central region 402c of the first layer 402. The central region 402c of the first layer 402 may be understood as a region, which is at least partially (partially or completely) surrounded by a peripheral region 402p of the first layer 402.

The second layer 404 may include or may be formed from a semiconducting material (e.g. silicon, e.g. polycrystalline silicon) or may include or may be formed from an electrical conducting material. Alternatively or additionally, the second layer 404 may include or may be formed from a metal, e.g. copper or aluminum. For example, the second layer 404 may include one or more sublayers, wherein the sublayers may include different materials.

Optionally, an inter-layer (not shown) may be formed between the first layer 402 and the second layer 404, e.g. extending at least over the peripheral region 404p of the second layer 404, or e.g. extending at least over the peripheral region 404p of the second layer 404 and over the central region 404c of the second layer 404.

The inter-layer may include or may be formed from an electrically insulating material, e.g. an oxide material (e.g. silicon oxide). Alternatively or additionally, the inter-layer may be formed analogue to the passivation layer. For example, a surface region of the first layer 402 may be oxidized to form the inter-layer. The inter-layer may provide an electrical isolation between first layer 402 and the second layer 404 and may also be referred as the insulating layer in this case. Alternatively or additionally, the inter-layer may include or may be formed from a metal, e.g. copper or aluminum. For example, the inter-layer may include one or more sublayers, wherein the sublayers may include different materials. The inter-layer may have a thickness (in vertical direction) in the range from about 0.01 µm to about 10 µm, e.g. in the range from about 0.1 µm to about 1 µm.

The central region 402c of the first layer 402 may be covered by the second layer 404 and the peripheral region 402p of the first layer 402 may be free from the second layer 404. For example, the second layer 404 may be formed using a mask and/or by removing material of the second layer 404 at least partially (e.g. at least over the peripheral region 402p of the first layer 402), to expose the peripheral region 402p of the first layer 402. For example, the second layer 404 may be removed partially by etching the second layer 404.

According to various embodiments, the peripheral region 402p of the first layer 402 may be structured, as illustrated in FIG. 4C. By the use of structuring, the connection structure (e.g. the one or more spring arms) may be formed. For example, material of the peripheral region 402p of the first layer 402 may be removed, e.g. by etching the peripheral region 402p of the first layer 402. Structuring the peripheral region 402p of the first layer 402 may include exposing the semiconductor carrier 204. For example, one or more openings 404o, e.g. trenches or through holes, may be formed into the peripheral region 402p of the first layer 402. The openings 404o may be formed into the peripheral region 402p of the first layer 402 by using a mask (e.g. formed from a resist), e.g. a photo mask. In this case the regions of the peripheral region 402p of the first layer 402, which are designated to remain on the semiconductor carrier 204 may be covered by the mask, to be protected from being structured, e.g. etched. In other words, the mask may be applied to the peripheral region 402p of the first layer 402, to cover one or more region, which is/are designated to remain on the semiconductor carrier 204.

Alternatively, the peripheral region 402p of the first layer 402 may be structured by forming the second layer 404 using a mask. The mask may be applied to the semiconductor carrier 204, to cover one or more regions, which is/are designated to remain free of the second layer 404. Illustratively, the openings 404o in the peripheral region 402p of the first layer 402 may be formed by shadowing the semiconductor carrier 204 (using a mask).

Illustratively, the one or more openings 404o may separate the peripheral region 402p of the first layer 402 into one or more spring arms, e.g. in form of bridges.

Figure 5A:
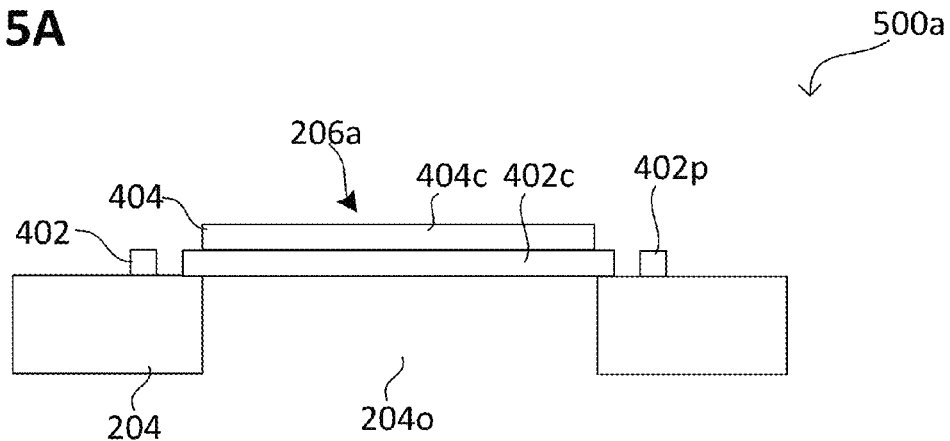
FIG. 5A, FIG. 5B and FIG. 5C respectively show a microelectromechanical device according to various embodiments in a method for forming a microelectromechanical device according to various embodiments in a schematic cross sectional view.
Figure 5B:
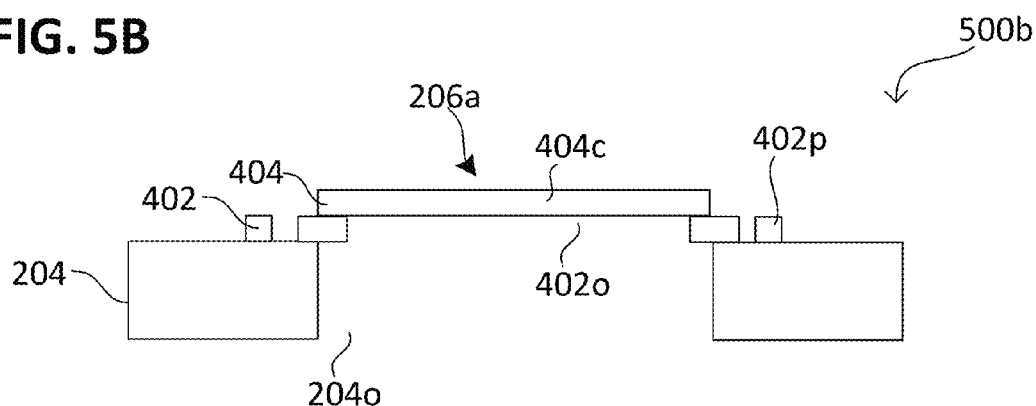
Figure 5C:
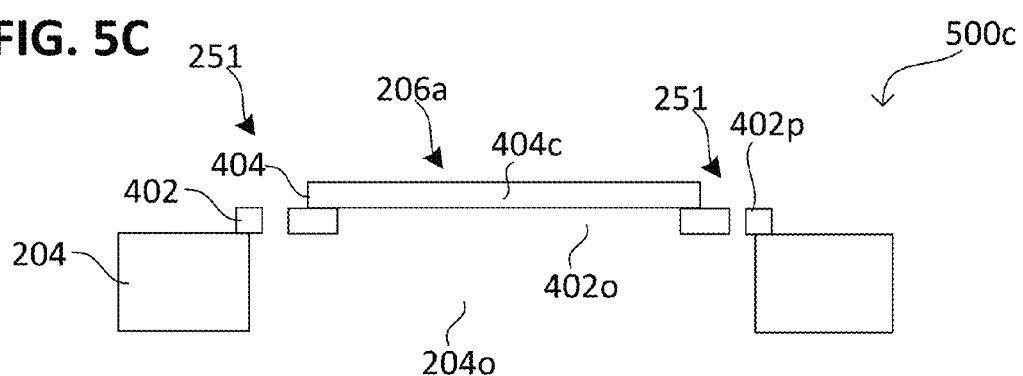

FIG. 5A, FIG. 5B and FIG. 5C respectively illustrate a microelectromechanical device 500a, 500b, 500c according to various embodiments in a method for forming a microelectromechanical device according to various embodiments.

According to various embodiments, material may be removed under at least a central region 402c of the second layer, e.g. to release (in other words, disengage) the central region 404c of the second layer 404, as illustrated in FIG. 5A. For example, material of the semiconductor carrier 204 may be removed to form the opening 204o. The opening 204o may extend through the whole semiconductor carrier 204 (in a vertical direction). By removing material of the semiconductor carrier 204 the first layer 402, e.g. the central region 402c of the first layer 402, may be exposed. Illustratively, the backside of the first layer 402 may be exposed.

According to various embodiments, material may be removed under at least a central region 402c of the second layer, as illustrated in FIG. 5B. For example, material of the first layer 204 (e.g. material in the central region 404c of the first layer 204) may be removed to form an opening 402o in the first layer 204. The opening 402o may extend through the whole first layer 204. By removing material of the first layer 204 the second layer 404, e.g. the central region 404c of the second layer 404, may be exposed. Illustratively, the backside of the second layer 404 may be exposed.

Illustratively, in this step, the central region 404c of the second layer 404 may be released to form a free-hanging region of the second layer 404 (e.g. at least the central region 404c of the second layer 404), which is only coupled by the first layer 402.

According to various embodiments, material may be removed under at least the peripheral region 402p of the first layer 402, as illustrated in FIG. 5C. For example, material of the semiconductor carrier 204 may be removed to extend the opening 204o in a lateral direction. The opening 204o may extend over at least the connection structure 251 (e.g. the one or more spring arms 208) in the peripheral region 402p of the first layer 402. By removing material of the semiconductor carrier 204 the first layer 402 may be exposed. Illustratively, the back side (opposite the top side) of the first layer 402 may be exposed.

Illustratively, in this step, the connection structure 251 (e.g. the one or more spring arms 208) may be released to form free-hanging connection structure 251 (e.g. the one or more spring arms 208).

Figure 6A:
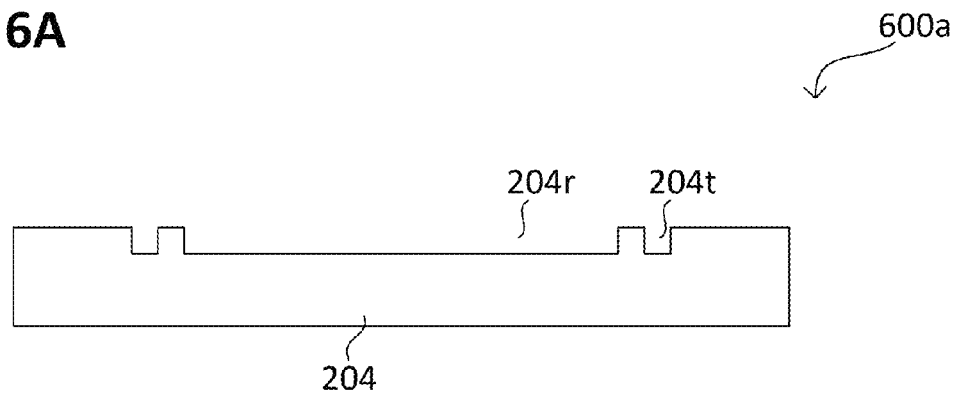
FIG. 6A, FIG. 6B and FIG. 6C respectively show a microelectromechanical device according to various embodiments in a method for forming a microelectromechanical device according to various embodiments in a schematic cross sectional view.
Figure 6B:
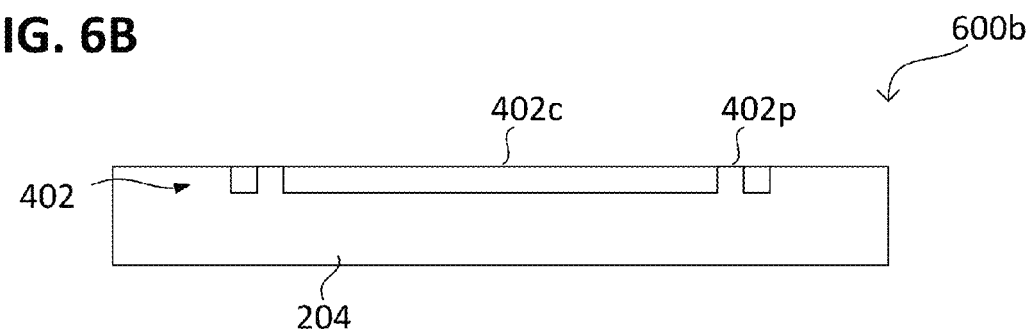
Figure 6C:
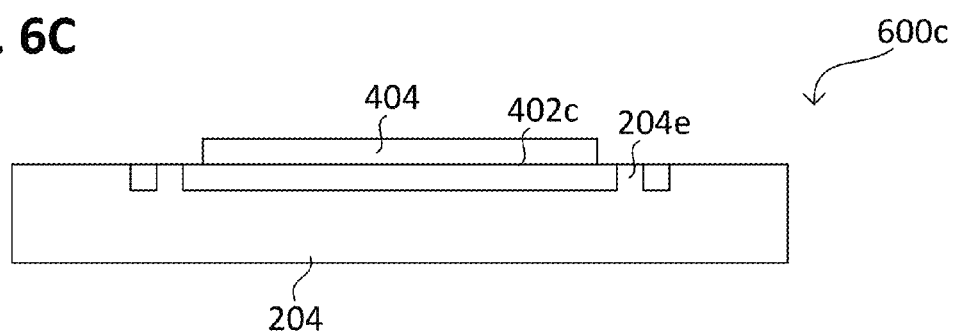

FIG. 6A, FIG. 6B and FIG. 6C respectively illustrate a microelectromechanical device 600a, 600b, 600c according to various embodiments in a method for forming a microelectromechanical device according to various embodiments.

According to various embodiments, the peripheral region 402p of the first layer 402 may be structured by forming a recess 204r and by forming one or more trenches 204t in the semiconductor carrier 204, as illustrated in FIG. 6A, and forming the first layer 402 at least partially in or over (e.g. at least one of in or over) the recess 204r, as illustrated in FIG. 6B. For example, the recess 204r may be filled with material of the first layer 402 at least partially (partially or completely) and the one or more trenches 204t may be filled with material of the first layer 402 at least partially (partially or completely). The trenches 204t may be designated to form the one or more spring arms. Illustratively, the one or more trenches 204t may be a negative form (also referred as pre-form) of the more spring arms. Further, the second layer 404 may be formed at least one of in or over the first layer 402, as described above and as illustrated in FIG. 6C.

Figure 7A:
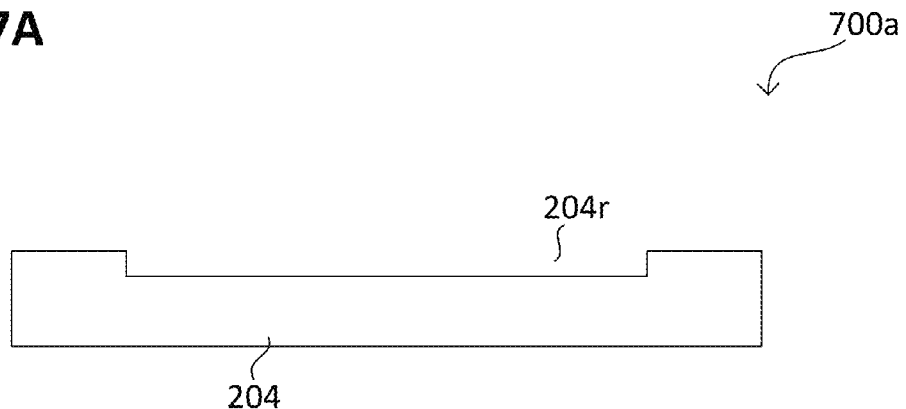
FIG. 7A, FIG. 7B and FIG. 7C respectively show a microelectromechanical device according to various embodiments in a method for forming a microelectromechanical device according to various embodiments in a schematic cross sectional view.
Figure 7B:
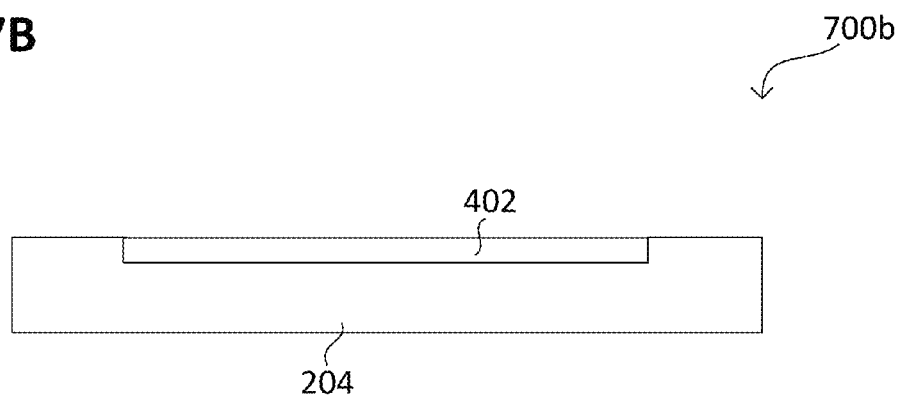
Figure 7C:
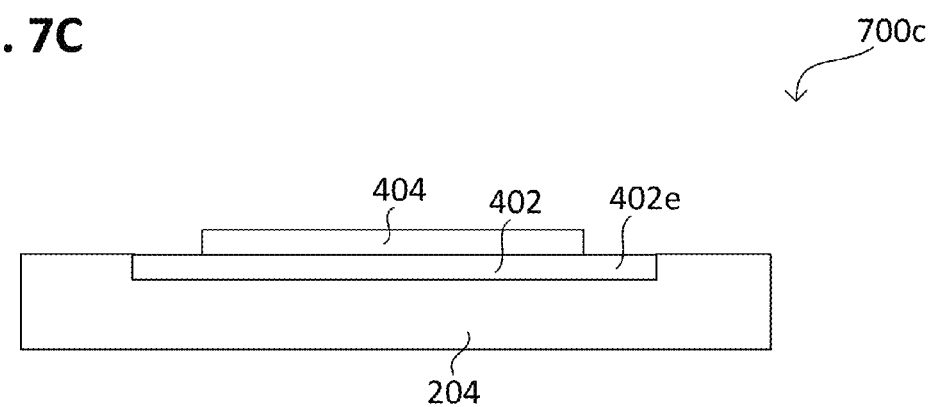

FIG. 7A, FIG. 7B and FIG. 7C respectively illustrate a microelectromechanical device 700a, 700b, 700c according to various embodiments in a method for forming a microelectromechanical device according to various embodiments.

Alternatively, the peripheral region 402p of the first layer 402 may be structured, by a combination of the above-mentioned steps. As illustrated in FIG. 7A, the recess 204r may be formed in the semiconductor carrier 204. Further, the first layer 402 may be formed at least partially in or over (e.g. at least one of in or over) the recess 204r, as illustrated in FIG. 7B. For example, the recess 204r may be filled with material of the first layer 402 at least partially. Further, the second layer 404 may be formed at least one of in or over the first layer 402, as described above and as illustrated in FIG. 7C.

Figure 8A:
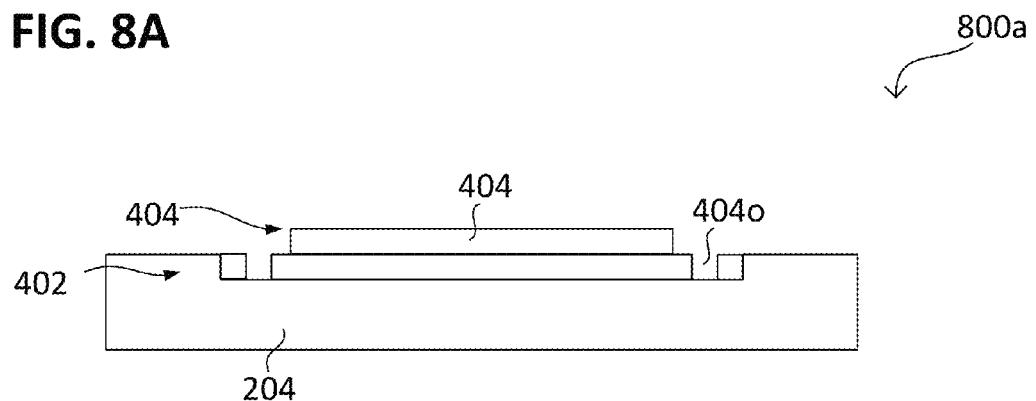
FIG. 8A, FIG. 8B and FIG. 8C respectively show a microelectromechanical device according to various embodiments in a method for forming a microelectromechanical device according to various embodiments in a schematic cross sectional view.
Figure 8B:
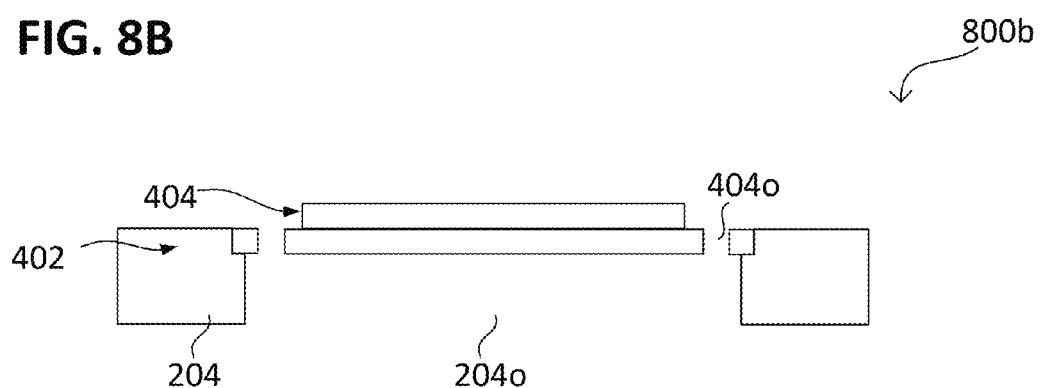
Figure 8C:
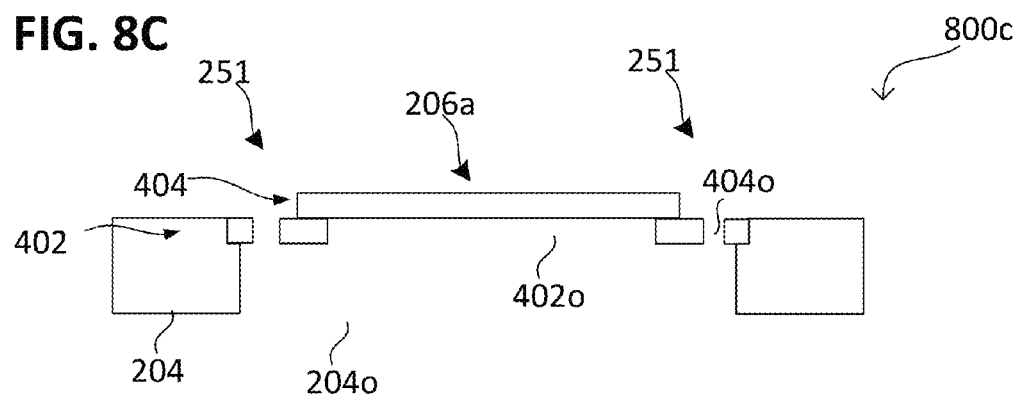

FIG. 8A, FIG. 8B and FIG. 8C respectively illustrate a microelectromechanical device 800a, 800b, 800c according to various embodiments in a method for forming a microelectromechanical device according to various embodiments.

According to various embodiments, the one or more openings 404o may be formed in the first layer 404 as illustrated in FIG. 8A. The one or more openings 404o may be formed, e.g. by removing material 204e of the semiconductor carrier 204 of the microelectromechanical device 600c, as illustrated in FIG. 6C, or e.g. by removing material 404e of the first layer 402e of the microelectromechanical device 700c, as illustrated in FIG. 7C.

According to various embodiments, the opening 204o may be formed in the semiconductor carrier 204, as illustrated in FIG. 8B. Further, the opening 402o may be formed in the first layer 402, as illustrated in FIG. 8C.

Figure 9A:
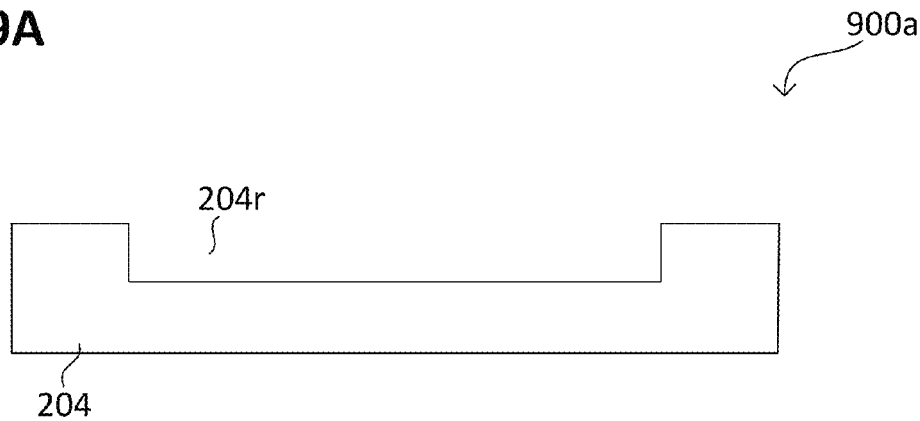
FIG. 9A, FIG. 9B and FIG. 9C respectively show a microelectromechanical device according to various embodiments in a method for forming a microelectromechanical device according to various embodiments in a schematic cross sectional view.
Figure 9B:
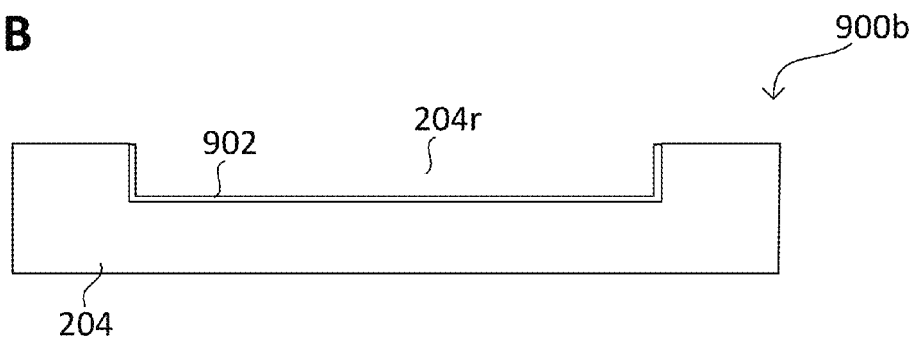
Figure 9C:
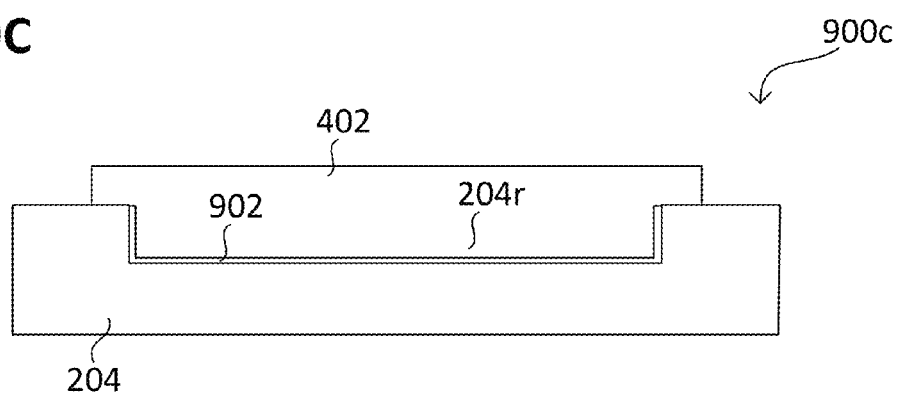

FIG. 9A, FIG. 9B and FIG. 9C respectively illustrate a microelectromechanical device 900a, 900b, 900c according to various embodiments in a method for forming a microelectromechanical device according to various embodiments.

According to various embodiments, a recess 204r may be formed in the semiconductor carrier 204, as illustrated in FIG. 9A. Further, an insulating layer 902 may be formed in the recess 204r, as illustrated in FIG. 9B. The insulating layer 902 may include or may be formed from an electrically insulating material, e.g. an oxide material (e.g. silicon oxide). For example, a surface (in the recess 204r) of the semiconductor carrier 204 may be oxidized to form the insulating layer 902. The insulating layer 902 (also referred as first insulating layer 902) may cover at least the bottom of the recess 204r, e.g. the bottom of the recess 204r and the sidewalls of the recess 204r.

The first insulating layer 902 may have a thickness (in vertical direction) in the range from about 0.01 µm to about 10 µm, e.g. in the range from about 0.1 µm to about 1 µm.

According to various embodiments, the first layer 402 may be formed at least partially in or over (at least one of in or over) the recess 204r of the semiconductor carrier 204, as illustrated in FIG. 9C. For example, the first layer 402 may extend over the recess 204r in the semiconductor carrier 204. For example, the first layer 402 may have a lateral extension larger than a lateral extension of the recess 204r in the semiconductor carrier 204. In this case, the first layer 402 may be also formed over a region of the semiconductor carrier 204 next to (e.g. outside) the recess 204r in the semiconductor carrier 204. Alternatively or additionally, the first layer 402 (illustratively, the thickness of the first layer 402) may have a vertical extension larger than a vertical extension of the recess 204r (illustratively, the depth of the recess 204r) in the semiconductor carrier 204.

Figure 10A:
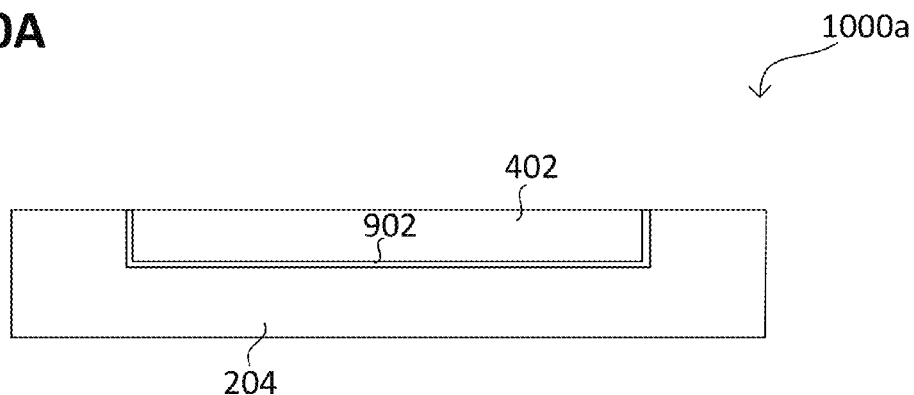
FIG. 10A, FIG. 10B and FIG. 10C respectively show a microelectromechanical device according to various embodiments in a method for forming a microelectromechanical device according to various embodiments in a schematic cross sectional view.
Figure 10B:
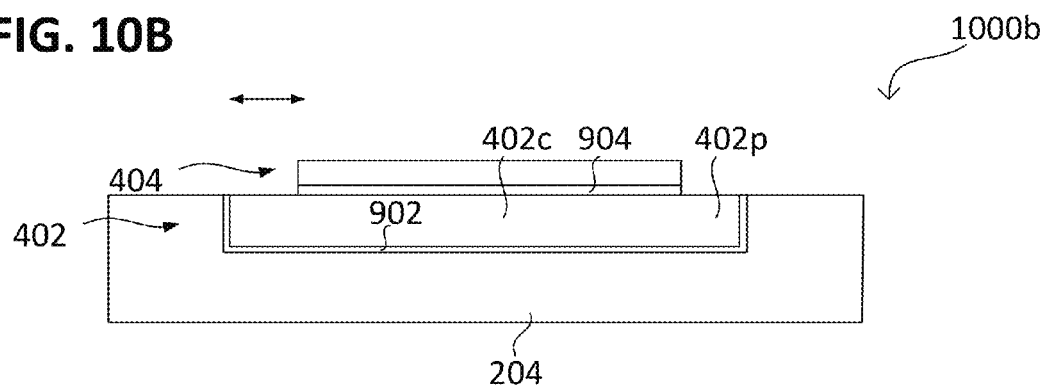
Figure 10C:
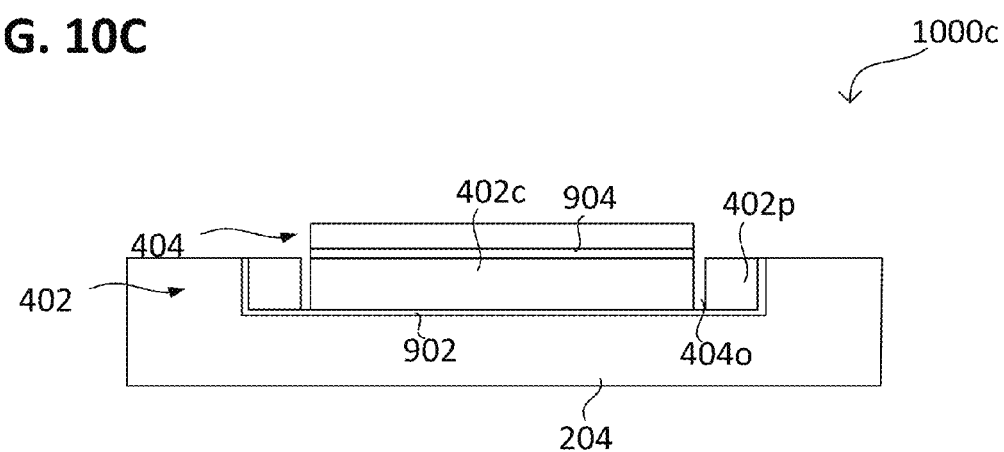

FIG. 10A, FIG. 10B and FIG. 10C respectively illustrate a microelectromechanical device 1000a, 1000b, 1000c according to various embodiments in a method for forming a microelectromechanical device according to various embodiments.

According to various embodiments, material of the first layer 402 may be removed at least partially over the recess 204r in the semiconductor carrier 204, as illustrated in FIG. 9C. Illustratively, the first layer 402 may be thinned down to the extension of the recess 204r. Additionally, material of the first layer 402 may be removed over a region of the semiconductor carrier 204 next to (e.g. outside) the recess 204r in the semiconductor carrier 204. In this step the first layer 402 may be planarized, e.g. to form a planar surface (e.g. at least in the central region 402c) with the semiconductor carrier 204. For example, the material of the first layer 402 may be removed by etching or polishing (e.g. electrochemical polishing, plasma polishing and/or mechanical polishing).

According to various embodiments, an insulating layer 904 (also referred as second insulating layer 904) may be formed over the first layer 402, as illustrated in FIG. 10B. The insulating layer 904 may be formed at least one of in or over (in other words, at least one of in and over) at least a central region 402c of the first layer 402. Optionally, the insulating layer 904 may also be formed at least one of in or over at least a peripheral region 402p of the first layer 402.

The second insulating layer 904 may have a thickness (in vertical direction) in the range from about 0.01 µm to about 10 µm, e.g. in the range from about 0.1 µm to about 1 µm.

The second insulating layer 902 may include or may be formed from an electrically insulating material, e.g. an oxide material (e.g. silicon oxide). For example, a surface region of the first layer 402 may be oxidized to form the second insulating layer 904. The second insulating layer 904 may cover at least the central region 402c of the first layer 402. For example, the second insulating layer 904 may cover the central region 402c of the first layer 402 and the peripheral region 402p of the first layer 402. Alternatively, the peripheral region 402p of the first layer 402 may remain free of the second insulating layer 904. For example, the second insulating layer 904 may be formed using a mask, in analogy the previous description.

According to various embodiments, the second layer 404 may be formed over the first layer 402, e.g. over the second insulating layer 904, as illustrated in FIG. 10B. The second layer 404 may be formed at least one of in or over at least a central region 402c of the first layer 402. The peripheral region 402p of the first layer 402 may remain free of the second layer 404. For example, the second layer 404 may be formed using a mask, in analogy the previous description.

According to various embodiments, the peripheral region 402p of the first layer 402 may be structured, as illustrated in FIG. 10C. By structuring the peripheral region 402p of the first layer 402, the one or more spring arms may be formed. For example, material of the peripheral region 402p of the first layer 402 may be removed, e.g. by etching the peripheral region 402p of the first layer 402, for forming one or more openings 404o. For example, at least one opening 404o of the one or more openings 404o may be formed as a trench.

If the openings 404o (the one or more openings 404o) are formed by etching the peripheral region 402p of the first layer 402, e.g. using an etching agent, the first insulating layer 902 may be used as etch stop for the etching agent.

Figure 11A:
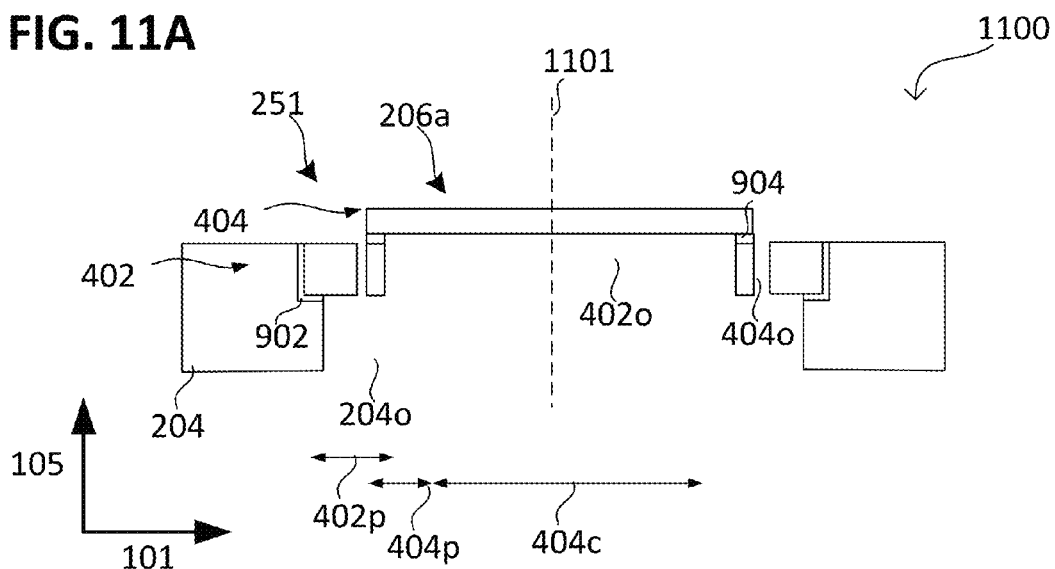
FIG. 11A and FIG. 11B respectively show a microelectromechanical device according to various embodiments in a method for forming a microelectromechanical device according to various embodiments in a schematic cross sectional view.

FIG. 11A illustrates a microelectromechanical device 1100 according to various embodiments in a method for forming a microelectromechanical device according to various embodiments.

According to various embodiments, the opening 204*o* and the opening 402*o* may be formed, as illustrated in FIG. 11A, e.g. using etching. In other words, material may be removed under at least a central region 402*c* of the second layer 404. For example, the semiconductor carrier 204 may be etched with a first etchant (also referred as first etchant agent) to form the opening 204*o*. The first insulation layer 902 may be used as an etch stop layer for the first etchant. In other words, the first insulation layer 902 may not be removed by the first etchant (e.g. the first insulation layer 902 may be inert to the first etchant). By forming the opening 204*o* at least the first insulation layer 902 may be exposed.

Further, the region of the first insulation layer 902, which is exposed by the opening 204*o*, may be removed to expose the first layer 402.

According to various embodiments, the region of the first layer 402, which is exposed by the opening 204*o*, may be removed. For example, the first layer 402 may be etched with a second etchant (also referred as second etchant agent) to form the opening 402*o*. The second insulation layer 904 may be used as an etch stop layer for the second etchant. In other words, the second insulation layer 904 may not be removed by the second etchant (e.g. the second insulation layer 904 may be inert to the second etchant). By forming the opening 402*o* at least the second insulation layer 904 may be exposed.

According to various embodiments, an etchant may be understood as fluid (also referred as chemical-wet-etching, e.g. using an acid), gas (also referred as chemical-dry-etching, e.g. using a reactive gas and/or plasma), and/or ions (also referred as physical-dry-etching, e.g. using argon ions), etc.

The second etchant may be the same as the first etchant, e.g. the same acid, e.g. if the first layer 402 and the second layer 404 include the same material (or are formed from the same material) and/or e.g. if the first insulation layer 902 and the second insulation layer 904 include the same material (or are formed from the same material).

The region of the second insulation layer 904, which is exposed by the opening 402*o*, may be removed to expose the second layer 404. In other words, removing the first insulation layer 902 may include exposing the first layer 402.

Removing the first insulation layer 902 and/or removing the second insulation layer 904 may include etching, e.g. using another etchant (also referred as third etchant). The third etchant may be different to the first and/or the second etchant.

The material under the first layer 402 and/or the second layer 404 may be removed such, that the peripheral region 404*p* of the second layer 404 may overlap at least partially with the remaining first layer 402, as illustrated in FIG. 11A. Additionally, material of the second insulation layer 904 may remain between the peripheral region 404*p* of the second layer 404 and region of the first layer 402 overlapping each other (e.g. coupled to each other). In this case, the second layer 404 may be electrically isolated from the first layer 402.

Figure 11B:
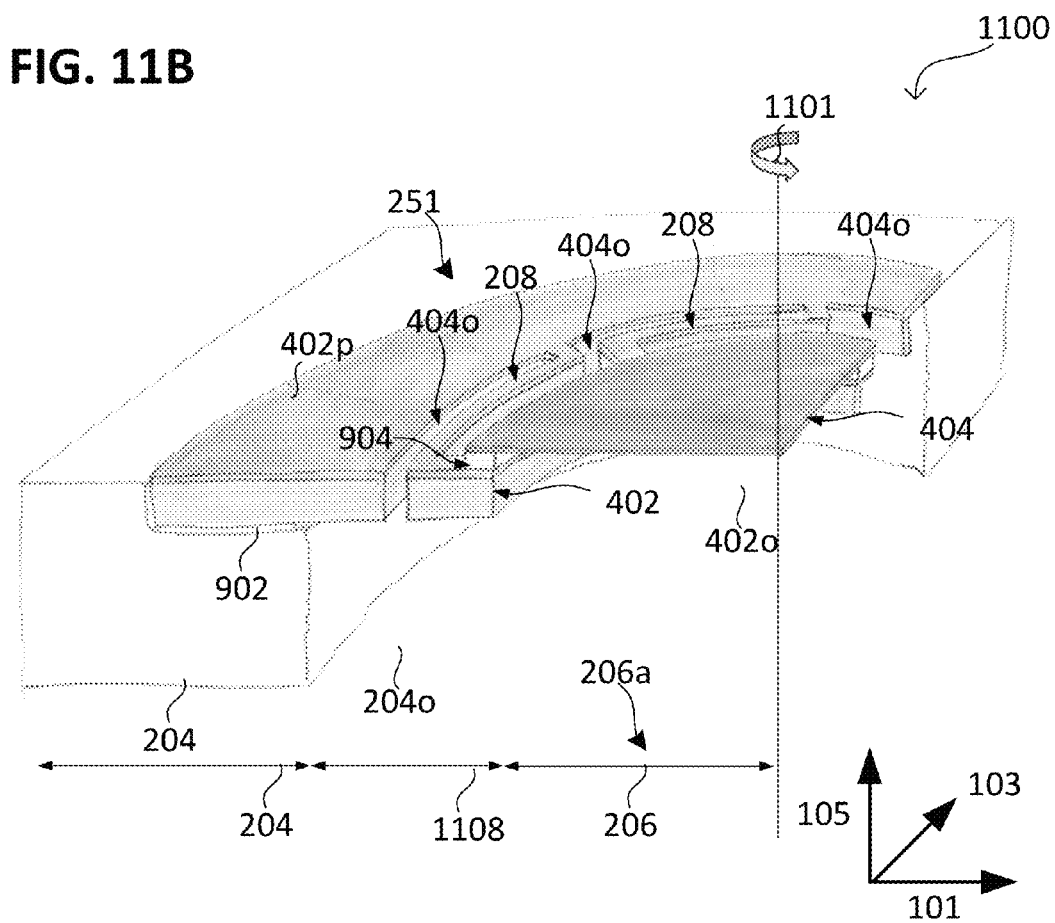

FIG. 11B illustrates the microelectromechanical device 1100 in a perspective cross sectional view. In FIG. 11B a quarter view of the microelectromechanical device 1100 is illustrated. For example, the whole microelectromechanical device 1100 may be obtained by rotating the cross sectional view in FIG. 11B around axis 1101 (out-of-plane axis 1101).

As illustrated in FIG. 11B, the microelectromechanical element 206 may include the second layer 404. Further, the one or more spring arms 208 (wherein two spring arms 208 are illustrated in FIG. 11B), e.g. eight spring arms 208 in total, include material of the first layer 402. In the first layer 402 the openings 404 may be formed as lines (illustratively as trenches), which extend through the first layer 402 (in vertical direction, e.g. direction 105). The openings 404 may separate the one or more spring arms 208 from each other. The one or more spring arms 208 may be formed as bridge structures or long ridge structures, e.g. which extend through the gap between the semiconductor carrier 204 (also referred as substrate) and the microelectromechanical element 206. At least one of the one or more spring arms 208 may be meander shaped. The one or more spring arms 208 may form a spring support 1108 (connection springs), e.g. a plate-like spring support 1108.

According to various embodiments, the one or more openings 404*o* may be stacked (into a lateral direction, e.g. a radial direction regarding axis 1101). For example, at least one (for example every) opening of the one or more openings 404*o* may include at least one (e.g. two) tangential portion (extending in a tangential direction regarding axis 1101) and at least one radial portion (extending in a radial direction regarding axis 1101). For example, the radial portion of an opening may connect the two tangential portions of the opening. If the microelectromechanical element 206 is not rotational symmetric, the openings may include a circumferential portion instead of a tangential portion.

In analogy, the one or more spring arms 208 may be stacked (into a lateral direction, e.g. a tangential direction regarding axis 1101). For example, at least one (for example every) spring arm of the one or more spring arms 208 may include at least one (e.g. two) tangential portion (extending in a tangential direction regarding axis 1101) and at least one radial portion (extending in a radial direction regarding axis 1101). For example, the tangential portion of a spring arm may connect the two radial portions of a spring arm. If the microelectromechanical element 206 is not rotational symmetric, the spring arms may include a circumferential portion instead of a tangential portion.

According to various embodiments, the spring arms 208 take the full movement in lateral direction, e.g. if the microelectromechanical element 206 is moved relative to the substrate into the lateral direction (perpendicular to the vertical direction, e.g. perpendicular to direction 105). Further, a vertical movement of the microelectromechanical element 206 may be suppressed at least partially, e.g. through the anisotropic stiffness provided by the geometry (thickness/width ratio) of the one or more spring arms 208. The thickness/width ratio (can also be referred as to an aspect ratio) of the one or more spring arms 208 may be larger than about two, e.g. larger than about three, e.g. larger than about five, e.g. larger than about ten.

According to various embodiments, a controlled ventilation may be provided via the one or more openings 404*o* (between the one or more spring arms 208). The one or more openings 404*o* may be formed as narrow slots, as illustrated in FIG. 11B. The ventilation may be required for the usage of the microelectromechanical element 206 as microphone.

According to various embodiments, the opening 402*o* and the opening 204 may form a cavity, e.g. a combined cavity. Alternatively, the opening 402*o* and the opening 204 may form a through hole, as described before. For example, by mounting the semiconductor carrier 204 on a PCB (not shown), the opening 402o and the opening 204 may form a cavity with the PCB.

The peripheral region 402p of the first layer 402 may serve as supporting ridges, e.g. for coupling the spring structure 1108 to the semiconductor carrier 204.

According to various embodiments, the microelectromechanical element 206 may include a mechanical member (e.g. provided by the first layer 404) and an electrical member (not shown). The mechanical member and the electrical member may be coupled with each other, e.g. by means of an electrically force (e.g. capacitive) or a magnetically force (e.g. inductively). Alternatively or additionally, the mechanical member and the electrical member may be coupled piezoelectrically or resistively. For example, the electrical member may include or may be formed as an electrode, a coil or a wire.

The mechanical member may include or may be formed as a membrane (e.g. a diaphragm) or a bar, which may be mechanically stimulated, e.g. by a medium (e.g. a gas or a fluid), which is coupled to the mechanical member. For example, the medium may transfer mechanical energy to the mechanical member, e.g. a mechanical signal, e.g. an oscillation or an impulse, such that the mechanical member is moved relative to the electrical member.

For example, the microelectromechanical element may include or may be formed as a sonic transducer (e.g. an acoustic transducer) for coupling with a medium, e.g. water or air. The sonic transducer may be configured to generate an electrical signal in response to receiving a sonic signal from the medium (illustratively, this may be used a microphone or a sonic sensor). Alternatively or additionally the sonic transducer may be configured to transfer a sonic signal to the medium in response to an electrical signal (illustratively, this may be used a speaker).

A movement of the mechanical member may induce the electrical member to generate or modify an electrical signal, e.g. a property of the electrical member may change, e.g. its capacitance. Therefore, a voltage supported to the electrical member may be changed due to the change of its capacitance. In other words, the electrical member may be configured to sense a movement of the mechanical member and to generate or modify an electrical signal based on the movement.

Alternatively, an electrical signal supported to the electrical member may induce the mechanical member to move, e.g. to vibrate. The electrical signal may generate or modify a force which affects the position of the mechanical member, e.g. an electrical force (e.g. capacitively) or a magnetical force (e.g. inductively). Through the movement, the mechanical member may transfer mechanical energy to the medium, e.g. the mechanical member may emit sonic, e.g. sound. In other words, the electrical member may be configured to move the mechanical member based on the electrical signal for generating or modifying the mechanical signal.

According to various embodiments, the spring arms 208 may extend in a lateral direction (illustratively, they may have a length), e.g. measured in a tangential direction regarding axis 1101, in the range from about 10 μm to about 500 μm, e.g. in the range from about 50 μm to about 200 μm, e.g. in the range from about 75 μm to about 150 μm, e.g. about 100 μm. The number of the spring arms 208 (e.g. every spring arms 208 of the one or more spring arms 208) may be defined by their length and the circumference of the microelectromechanical element 206. According to various embodiments, the number of the spring arms 208 may be in the range from about 2 to about 100, e.g. in the range from about 5 to about 80, e.g. in the range from about 8 to about 75, e.g. in the range from about 10 to about 50, e.g. in the range from about 20 to about 40, e.g. about 30.

According to various embodiments, the spring arms 208 (e.g. every spring arm 208 of the one or more spring arms 208) may extend in a lateral direction (illustratively, they may have a width), e.g. measured in a radial direction regarding axis 1101, in the range from about 0.1 μm to about 10 μm, e.g. in the range from about 0.5 μm to about 5 μm, e.g. in the range from about 1 μm to about 2 μm.

According to various embodiments, the connection structure 251, e.g. the one or more spring arms 208 (e.g. every spring arm 208 of the one or more spring arms 208), may extend in a vertical direction (illustratively, they may have a height or a thickness), measured parallel to axis 1101, in the range from about 1 μm to about 50 μm, e.g. in the range from about 2 μm to about 30 μm, e.g. in the range from about 5 μm to about 20 μm.

With larger height and larger width, the spring arms 208 (e.g. every spring arm 208 of the one or more spring arms 208) may be able to absorb a higher force. In other words, the spring arms 208 may generate a higher spring force. With smaller length, the spring arms 208 (e.g. every spring arms 208 of the one or more spring arms 208) may be able to absorb a higher force.

In one example, the number of the spring arms 208 may be about 30, wherein their length may be about 100 μm. In this example, the spring arms 208 (e.g. every spring arm 208 of the one or more spring arms 208) may be able to absorb a force smaller than 1 mN (Millinetwton), e.g. the force pointing into a lateral direction.

According to various embodiments, the openings 404o of the connection structure 251 (e.g. every opening 404o separating two of the one or more openings 404o) may extend in a lateral direction (illustratively, they may have a width), e.g. measured in a radial direction regarding axis 1101, in the range from about 0.1 μm to about 10 μm, e.g. in the range from about 0.5 μm to about 2 μm. The larger the width of the openings 404o is, the smaller a flow resistance may be which defines the gas flow through the openings 404o (also referred as venting). The width of the openings 404o may be small enough to prevent an acoustic shortcut and large enough that the spring arms 208 may deflect, e.g. to absorb mechanical load.

The connection structure 251, e.g. via the one or more spring arms 208 (also referred as spring support 1108), may illustratively, springy support the microelectromechanical element 206. The geometry of the spring arms 208 (e.g. every spring arm 208 of the one or more spring arms 208), e.g. their thickness, width and length, may define a resonance frequency of the spring arms 208. The resonance frequency may be larger than acoustic frequencies, e.g. larger than 20 kHz (Kilohertz), e.g. larger than 40 kHz, e.g. larger than 60 kHz, e.g. larger than 100 kHz, e.g. larger than 500 kHz. This may avoid interference of the resonance frequency of the spring arms 208 with the resonance frequency of the microelectromechanical element 206 or with measured frequencies, e.g. if the microelectromechanical element 206 is used for measuring acoustic frequencies (illustratively sound), e.g. for using the microelectromechanical element 206 as microphone.

Further, the connection structure 251, e.g. the one or more spring arms 208 (e.g. every spring arm 208 of the one or more spring arms 208), may be configured to be resistant (not affected) by the sonic signals, e.g. acoustic signals, or other mechanical signals. In other words, the position (vertical distance) of the microelectromechanical element 206 relative to the semiconductor carrier 204 may be not affected by the sonic signals. For example, the connection structure 251, e.g. the one or more the spring arms 208, may be configured such that they substantially do not absorb energy from the mechanical signal, e.g. from an acoustic signals (illustratively, from the acoustic pressure). This enables to avoid influences of the connection structure 251, e.g. the one or more spring arms 208 on the conversation of the mechanical signal into an electrical signal. Illustratively, this enables to avoid incorrect measurements.

According to various embodiments, the opening 204o may extend in a lateral direction (illustratively, they may have a width, e.g. a diameter), e.g. measured in a radial direction regarding axis 1101, in the range from about 0.1 mm to about 10 mm, e.g. in the range from about 0.5 mm to about 2 mm, e.g. about 1 mm.

Figure 12A:
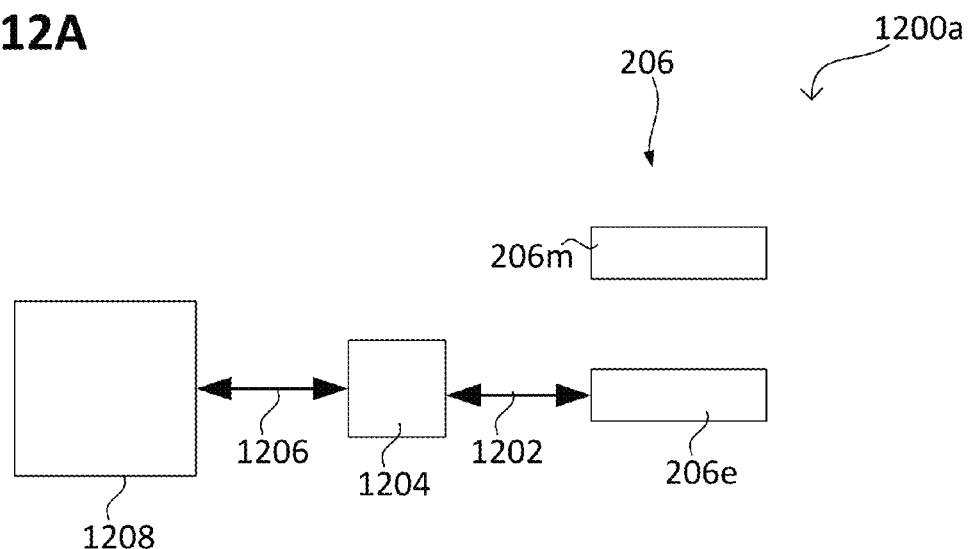
FIG. 12A and FIG. 12B respectively show a microelectromechanical device according to various embodiments in a schematic view.
Figure 12B:
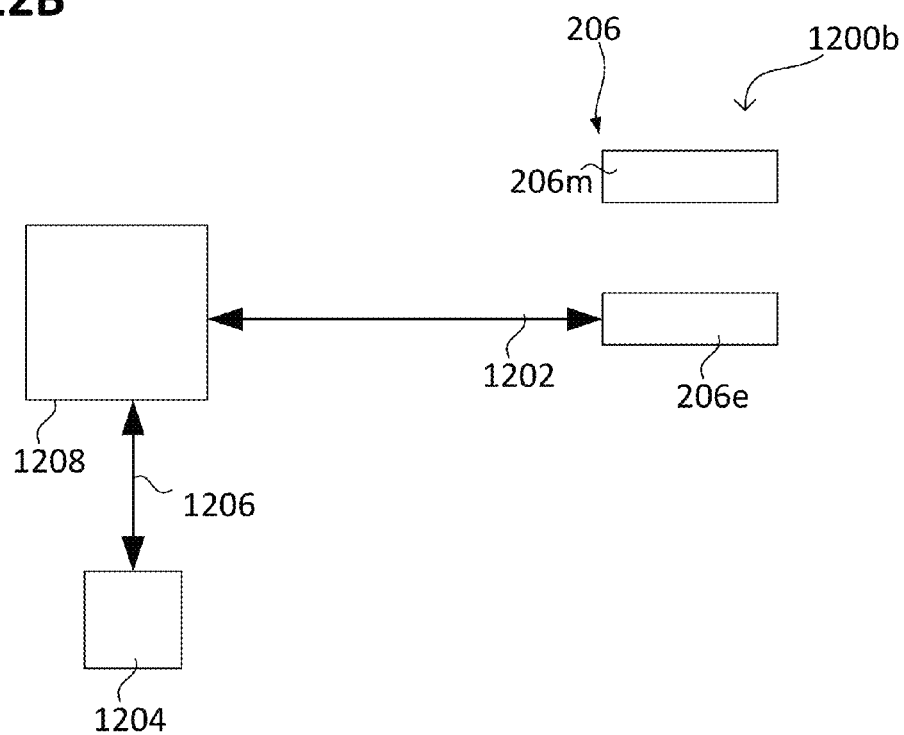

FIG. 12A and FIG. 12B respectively illustrate a microelectromechanical device 1200a, 1200b in a schematic view.

According to various embodiments, the electrical member 206e may be electrically coupled 1202 to the contact pad 1204, as illustrated in FIG. 12A. The contact pad may be electrically connected 1206 to an electrical circuit 1208 (e.g. an integrated circuit, e.g. integrated in the semiconductor carrier 204). In other words, the contact pad 1204 may be electrically coupled 1202 between the electrical member 206e and the electrical circuit 1208.

Alternatively, the electrical circuit 1208 may be electrically coupled 1202 between the electrical member 206e and the contact pad 1204, as illustrated in FIG. 12B.

The electrical circuit 1208 may be part of a driving unit, which is configured to drive the microelectromechanical element 206. For example, the driving unit, e.g. the electrical circuit 1208, may generate an electrical sensing signal (e.g. an electrical voltage or an electrical current) and support the electrical sensing signal to the electrical member 206e. The electrical sensing signal may be modified by the electrical member 206e, e.g. if the mechanical member 206 is affected (e.g. if the mechanical member 206 is moved) by a mechanical signal, e.g. an oscillation, a force or an impulse. This configuration may also be referred as passive microelectromechanical element 206. The modified electrical sensing signal is supported to the electrical circuit 1208 and/or sensed by the electrical circuit 1208 and may be processed by the electrical circuit 1208.

Alternatively or additionally, an electrical signal may be generated by the electrical member 206e, e.g. if the mechanical member 206 is affected (e.g. if the mechanical member 206 is moved) by a mechanical signal, e.g. an oscillation, a force or an impulse. This configuration may also referred as active microelectromechanical element 206. The generated electrical signal is supported to the electrical circuit 1208 and/or sensed by the electrical circuit 1208 and may be processed by the electrical circuit 1208.

According to various embodiments, the mechanical member 206m may be formed as membrane. The membrane may be configured to oscillate according to the extension of the membrane. The oscillation of the membrane may generate or modify an electrical signal. For example, the membrane may be capacitively coupled to an electrical member in form of an electrode. Due to the oscillation of the membrane, the distance between the electrode and the membrane is changed, which changes the capacity in accordance with the frequency of the oscillation of the membrane. Illustratively, the membrane may serve as second electrode, which forms a capacitor with the electrical member (capacitively coupling). Alternatively, the membrane may be formed as dielectricum of the capacitor.

According to various embodiments, the electrical circuit 1208 includes a data converter, which includes a data input/output interface. The data converter may be configured to convert data received at the input/output interface into an electrical signal (which may be supported to the microelectromechanical element 206). Alternatively or additionally, the data converter may be configured to convert an electrical signal (which may be provided by the microelectromechanical element 206) into data which is supported to the input/output interface.

The data (e.g. in form of analog data) may include driving data, e.g. for controlling or adjusting the microelectromechanical element. Alternatively or additionally, the data may include measurement data. For example, measurement data may include a value or a time stamp in which represent a mechanical input (e.g. a mechanical signal) that affects the mechanical member 206, e.g. an oscillation frequency and/or an oscillation damping of the membrane.

Optionally, the electrical circuit 1208 may include an analog/digital converter, which includes a data input/output interface. The analog/digital converter may be configured to convert a digital signal received at the input/output interface into an electrical signal (which may be supported to the microelectromechanical element 206). Alternatively or additionally, the analog/digital converter may be configured to convert an electrical signal (which may be provided by the microelectromechanical element 206) into a digital signal which is supported to the input/output interface. In other words, in this configuration the data may include digital data. In other words, a microelectromechanical device may provide (e.g. generate and output) digital data based on the mechanical signal. The digital data may be stored in a memory element of the microelectromechanical device, e.g. a random-access memory element.

Figure 13:
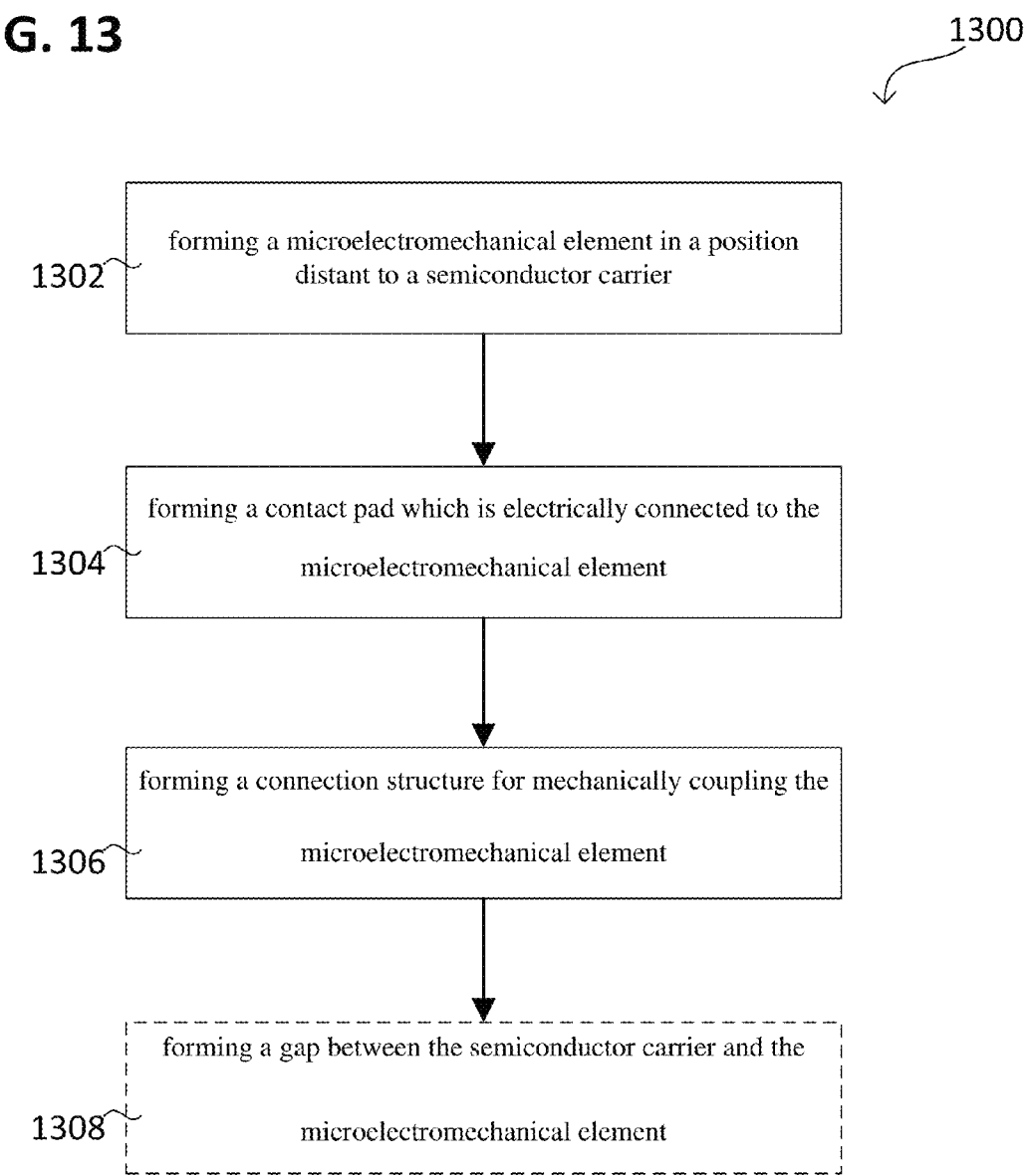

FIG. 13 illustrates a method 1300 for forming a microelectromechanical device in a schematic flow diagram. The method 1300 may provide forming a microelectromechanical device according to various embodiments, e.g. one of the previously described microelectromechanical devices.

According to various embodiments, the method 1300 may include in 1302 forming a microelectromechanical element in a position distant to a semiconductor carrier (e.g. at least one of in or over the semiconductor carrier, e.g. in an opening of the semiconductor carrier); in 1304 forming a contact pad which is electrically connected to the microelectromechanical element; in 1306 forming a connection structure (e.g. including or formed from one or more spring arms) extending between the semiconductor carrier and the microelectromechanical element for mechanically coupling the microelectromechanical element with the semiconductor carrier; and optionally in 1308 forming a gap between the semiconductor carrier and the microelectromechanical element, such that the connection structure (e.g. the one or more spring arms) extent through the gap. The contact pad may be electrically connected to the microelectromechanical element via the connection structure, e.g. via one or more electrically conductive layers (e.g. a metallization of the connection structure).

FIG. 14 illustrates a method 1400 for forming a microelectromechanical device in a schematic flow diagram. The method 1300 may provide forming a microelectromechanical device according to various embodiments, e.g. one of the previously described microelectromechanical devices.

According to various embodiments, the method 1400 may include in 1402 forming a first layer at least one of in or over a semiconductor carrier; in 1404 forming a second layer at least one of in or over at least a central region of the first layer, such that a peripheral region of the first layer is at least partially free of the second layer; optionally in 1406 structuring the peripheral region of the first layer to form one or more spring arms; and in 1408 removing material under at least a central region of the second layer to release the central region of the second layer; and/or removing material under at least the peripheral region of the first layer to release the connection structure (e.g. including or formed from one or more spring arms).

Optionally, the method 1300 may include forming one or more trenches (e.g. etching one or more trenches) into the substrate (to form the pre-form for the ridges). The one or more trenches may have a deepness (in vertical direction) in the range from about 1 µm to about 50 µm, e.g. in the range from about 2 µm to about 20 µm, e.g. in the range from about 5 µm to about 15 µm. The one or more trenches may have a width (in lateral direction) in the range from about 0.1 µm to about 20 µm, e.g. in the range from about 0.5 µm to about 10 µm, e.g. in the range from about 0.5 µm to about 5 µm, e.g. in the range from about 0.5 µm to about 2 µm.

In this case, the method 1300 may optionally include lining the one or more trenches, with a layer, e.g. with an insulation layer. The layer may include or may be formed from an oxide material. The layer may have a thickness (in vertical direction) in the range from about 0.01 µm to about 10 µm, e.g. in the range from about 0.1 µm to about 1 µm.

In the case the method 1300 may include forming a one or more trenches the method 1300 may optionally include filling the one or more trenches with a first layer material, e.g. a semiconducting material, e.g. same the material as the semiconductor carrier (also referred as substrate) includes, e.g. silicon, e.g. polycrystalline silicon. The first layer material may form the first layer or may be part of the first layer, e.g. as a first sublayer of the first layer. Filling the one or more trenches may include filling the one or more trenches until one or more trenches are closed. In other words, the one or more trenches may be filled completely with the first layer material.

Optionally, the method 1300 may include removing the first layer material at least partially, e.g. by polishing or milling the first layer material. In other words, the first layer may be polished down to trench niveau (also referred as trench level). Illustratively, the first layer may be polished down until it surface is aligned with surface of the semiconductor carrier 204.

Optionally, the method 1300 may include forming second layer material over the first layer material, e.g. a semiconducting material, e.g. same the material as the semiconductor carrier (also referred as substrate) includes, e.g. silicon, e.g. polycrystalline silicon, e.g. by depositing first layer material. The second layer material may be part of the first layer, e.g. a second sublayer of the first layer.

In this case, the method 1300 may include structuring the second layer material (e.g. the second sublayer) simultaneously with the first layer material (e.g. the first sublayer). In analogy, the first layer may include one or more additional sublayers, e.g. the one or more additional sublayers including a semiconducting material or a metallic material, e.g. a metal.

Optionally, the method 1300 may include forming one or more trenches in the first layer, filling the one or more trenches in the first layer with a third layer material, e.g. same the material as the semiconductor carrier (also referred as substrate) includes, e.g. silicon, e.g. polycrystalline silicon, e.g. by depositing first layer material. The third layer material may be part of the second layer, e.g. a first sublayer of the second layer. In analogy, the second layer may include one or more additional sublayers, e.g. the one or more additional sublayers including a semiconducting material or a metallic material, e.g. a metal. Optionally, the method 1300 may include removing a material, e.g. a sublayer, of the second layer partially, e.g. by polishing or milling the third layer material.

Alternatively or additionally, the method 1300 may include forming the one or more electrically conductive layers, e.g. at least one of in or over the semiconductor carrier, e.g. from an electrically conductive material, e.g. from a metal, e.g. from copper. The one or more electrically conductive layers may be electrically connected to one or more electrical members of the microelectromechanical element.

Optionally, the method 1300 may include forming one or more electrically conductive layers, e.g. at least one of in or over the connection structure, e.g. from an electrically conductive material, e.g. from a metal, e.g. from copper. In this case, the method 1300 may include structuring the electrically conductive layer to provide electronics integration such as metal lines and contact pads.

Optionally, the method 1300 may include forming an inter-layer, e.g. an insulation layer (e.g. from an oxide material), between the first layer and the second layer. In this case, removing material may include using the inter-layer as etch stop, e.g. for forming a cavity. The cavity may include an opening in the semiconductor carrier and/or an opening in the first layer. In this case removing material may include removing the inter-layer. The inter-layer may include or may be formed from an oxide material. The inter-layer may have a thickness (in vertical direction) in the range from about 0.01 µm to about 10 µm, e.g. in the range from about 0.1 µm to about 1 µm.

According to various embodiments, removing material may include releasing the central region of the second layer, wherein the peripheral region of the second layer remains coupled to the first layer, e.g. the connection structure (e.g. including or formed from one or more spring arms). Illustratively, the released second layer may provide a membrane, which may be used in accordance with the MEMS, e.g. as a microphone.

According to various embodiments, removing material may be performed from the backside of the semiconductor carrier. The backside may be the side opposite the front side (the side of the main processing surface) of the semiconductor carrier. The front side of the semiconductor carrier may be the side at least one of in or over which the first layer is formed and/or at least one of in or over which the second layer is formed.

According to various embodiments, the first layer may include or may be formed from a non-polymer and/or an inorganic material (in other words, at least one of a non-polymer and an inorganic material). An inorganic material may be understood as a material without carbon, except elementary carbon configurations, like graphene or graphite or diamond. For example, an inorganic material may include or may be formed from a metal, a semiconductor, an oxide, a carbide, a nitride, a ceramic, etc. A non-polymer material may be understood as material without silicon-silicon (e.g. in form of molecules) or carbon-carbon chains (e.g. in form of molecules). A non-polymer material may include or may be formed from strong chemical bonds such as covalent bonds, metallic bonds or ionic bonds (e.g. the substantially the whole or the whole bulk of the non-polymer material may be formed by strong bonds), e.g. substantially free of weak chemical bonds such as van der Waals forces. For example, a non-polymer may include or may be formed from a metal, an oxide, a semiconductor a carbide, a nitride, a ceramic, etc. For example, the first layer and/or the second layer may include or may be formed from silicon.

Alternatively or additionally, the first layer may include or may be formed from a crystalline, polycrystalline and/or nanocrystalline material. In other words, the first layer may include or may be formed from a material with at least crystalline order on nanometer scale, e.g. on micrometer scale, e.g. on millimeter scale. A crystalline material may be understood as including a crystalline order, e.g. a crystalline lattice. A polycrystalline and/or nanocrystalline material may include regions or particles (e.g. nanoparticles) in crystalline order, wherein the orientation of the crystalline order may be randomly distributed. For example, the first layer and/or the second layer may include or may be formed from crystalline silicon, polycrystalline silicon and/or nanocrystalline silicon.

A mechanical signal may be understood as a mechanical input or a mechanical influence. The mechanical signal may be defined by a mechanical force (e.g. a time dependent mechanical force) which impinges on an element or a device, e.g. the microelectromechanical element. The mechanical signal may include at least one of the following group of signals: sonic signal, a pressure signal, a vibration signal, an oscillation signal, an impulse signal, an acoustic signal. A pressure signal may include a pressure variation, e.g. transmitted by a gas or a fluid. For example, the pressure variations may generate a force on an element or a medium defined by the gradient of the pressure variations. A sonic signal may include sonic in gases, solids or in fluids, e.g. transmitted by periodic pressure variations. A vibration signal may include periodic oscillations of an element (e.g. the mechanical member) or a medium, e.g. a gas, a solid or a fluid. A vibration may include a periodic movement of the whole element (e.g. the mechanical member) or a medium. An acoustic signal may include sonic transmitted by a gas or a fluid in the hearable frequency range. An impulse signal may be defined by a mass and a velocity of the mass. The mass may be the mass of a medium or of the mechanical member.

In other words, the microelectromechanical device may detect sonic, a pressure change, a vibration, an oscillation, a force impact or velocity change, and/or an acoustic signal. The microelectromechanical device, e.g. the microelectromechanical element, may provide an electrical signal in response to sonic, a pressure change, a vibration, an oscillation, a force impact or velocity change, and/or an acoustic signal. Based on the electrical signal, the sonic, a pressure change, a vibration, an oscillation, a force impact or velocity change, and/or an acoustic signal may be characterized, e.g. analyzed.

Figure 15A:
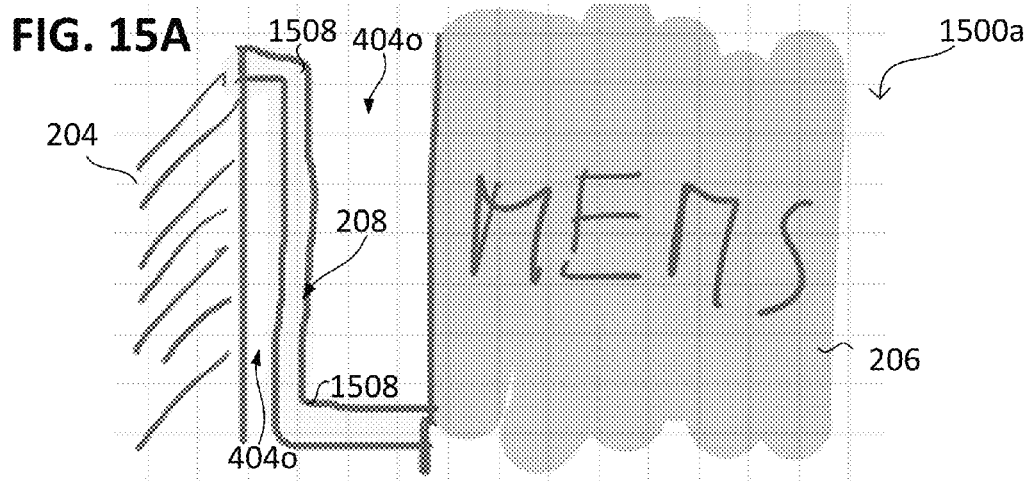
FIG. 15A, FIG. 15B and FIG. 15C respectively show a microelectromechanical device according to various embodiments in a method for forming a microelectromechanical device according to various embodiments in a schematic top view.
Figure 15B:
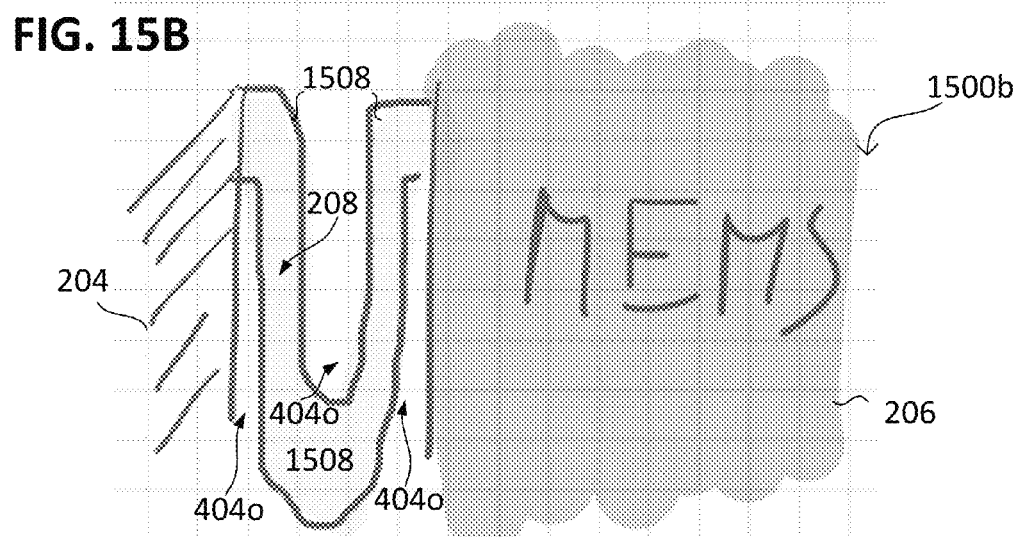
Figure 15C:
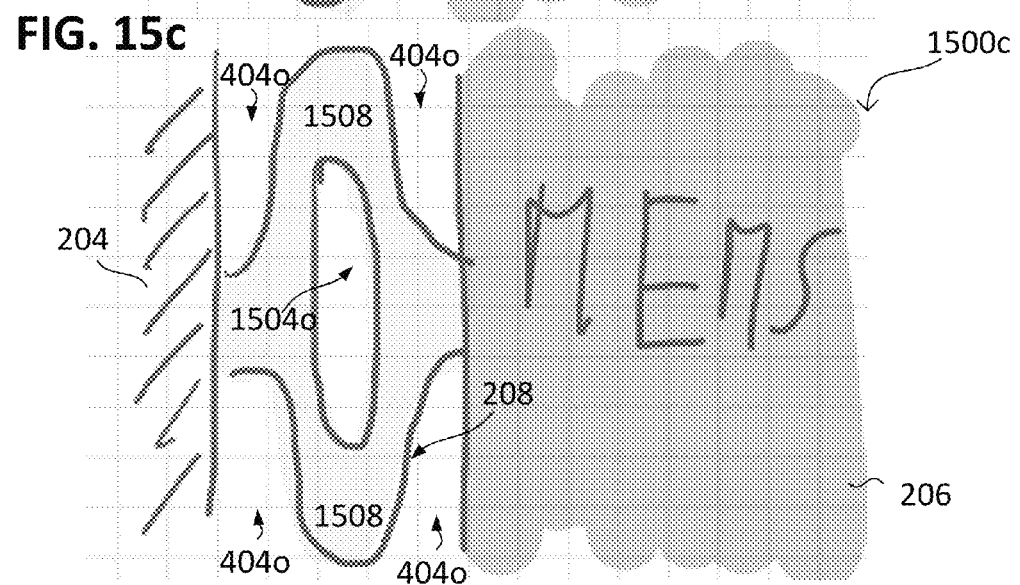

FIG. 15A, FIG. 15B and FIG. 15C respectively illustrate a microelectromechanical device 1500a, 1500b, 1500c according to various embodiments in a method for forming a microelectromechanical device according to various embodiments in a schematic top view.

The microelectromechanical device 1500a, 1500b, 1500c may include one or more spring arms 208 which extend from the semiconductor carrier 204 to the microelectromechanical element 206 and elastically couple the microelectromechanical element 206 with the semiconductor carrier 204. The one or more spring arms 208 may include various shapes, as among others may be S-shape, as exemplarily illustrated for the microelectromechanical device 1500a in FIG. 15A, U-shape, as exemplarily illustrated for the microelectromechanical device 1500b in FIG. 15B, and/or O-shape, as exemplarily illustrated for the microelectromechanical device 1500c in FIG. 15C. The one or more spring arms 208, e.g. each, may include al one curved region 1508.

The S-shaped spring arm 208 may include at least two curved regions 1508. The U-shaped spring arm 208 may include three curved regions 1508. The O-shaped spring arm 208 may include at least one opening 1504o extending through the spring arm 208. The O-shaped spring arm 208 may include at least two curved regions 1508. The at least one opening 1504o may be surrounded by the at least two curved regions 1508 of the O-shaped spring arm 208.

Figure 16A:
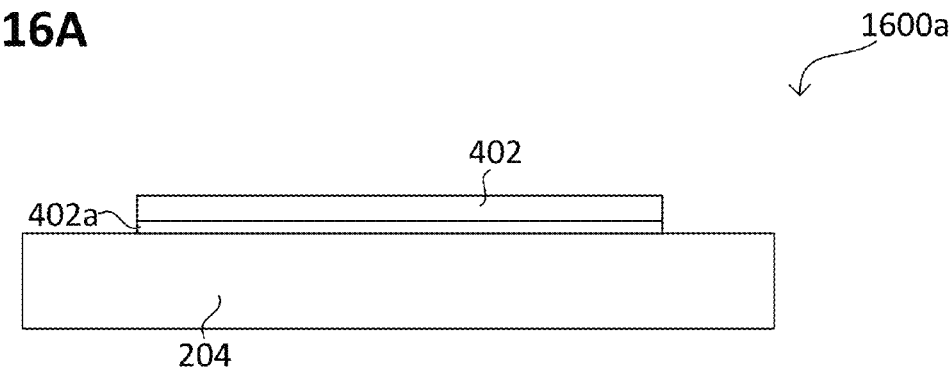
FIG. 16A, FIG. 16B and FIG. 16C respectively show a microelectromechanical device according to various embodiments in a method for forming a microelectromechanical device according to various embodiments in a schematic cross sectional view.
Figure 16B:
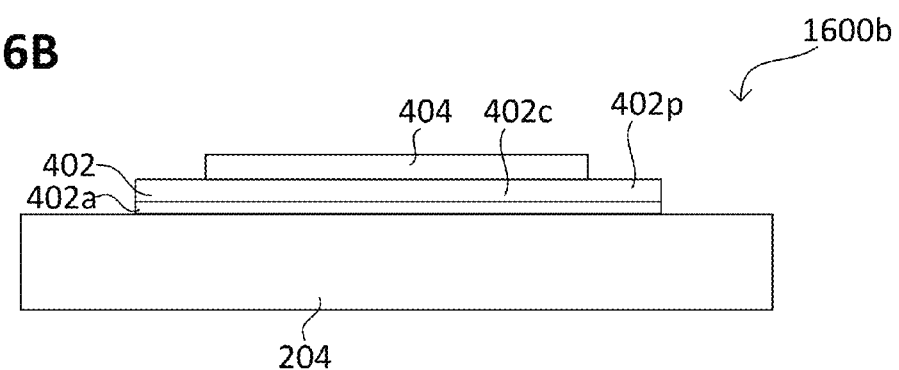
Figure 16C:
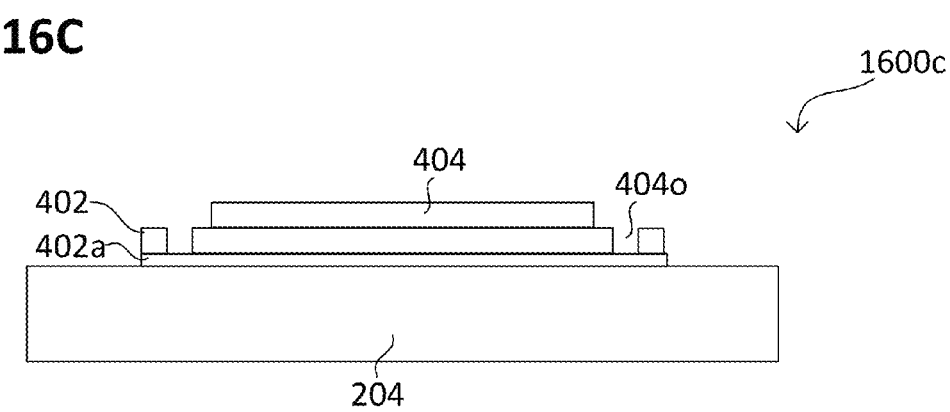

FIG. 16A, FIG. 16B and FIG. 16C respectively illustrate a microelectromechanical device 1600a, 1600b, 1600c according to various embodiments in a method for forming a microelectromechanical device according to various embodiments in a schematic cross sectional view. The microelectromechanical device 1600a, 1600b, 1600c may be similar to the microelectromechanical device 400a, 400b, 400c, wherein a dielectric layer 402a is formed or disposed between the first layer 402 and the semiconductor carrier 204. The dielectric layer 402a may be used as etch stop layer 402a, as illustrated in FIG. 16C. For example, one or more openings 404o, e.g. trenches or through holes, may be formed into the first layer 402. The one or more openings 404o may extend through the first layer 402 and expose the dielectric layer 402a. For forming the one or more openings 404o an etchant may be used, wherein the dielectric layer 402a may be used as an etch stop for the etchant.

Figure 17A:
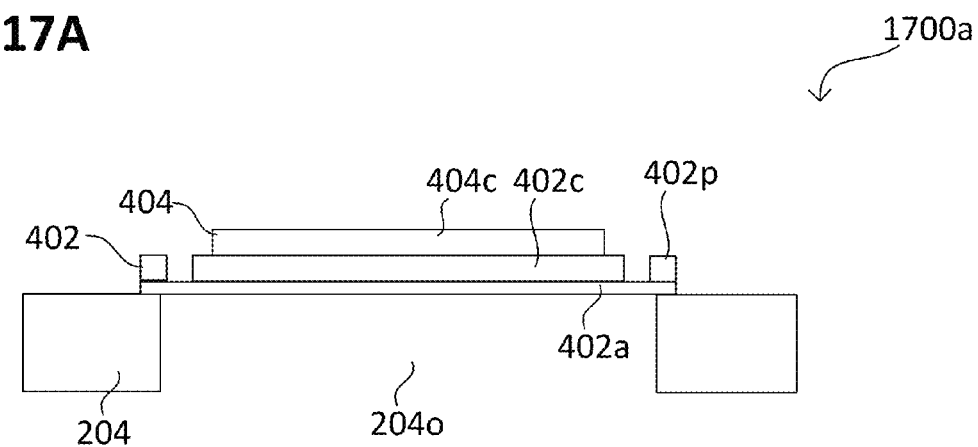
FIG. 17A and FIG. 17B respectively show a microelectromechanical device according to various embodiments in a method for forming a microelectromechanical device according to various embodiments in a schematic cross sectional view.
Figure 17B:
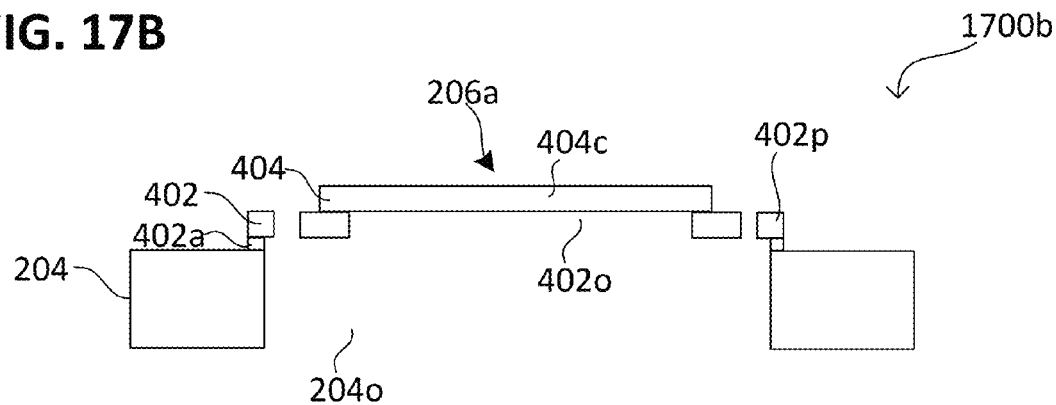

FIG. 17A and FIG. 17B respectively illustrate a microelectromechanical device 1700a, 1700b according to various embodiments in a method for forming a microelectromechanical device according to various embodiments in a schematic cross sectional view. The microelectromechanical device 1700a, 1700b may be similar to the microelectromechanical device 500a and 500c, wherein the dielectric layer 402a is formed or disposed between the first layer 402 and the semiconductor carrier 204. The opening 204o may extend through the semiconductor carrier 204 and expose the dielectric layer 402a (e.g. a side opposite the first layer 402), as illustrated in FIG. 17A. For forming the opening 204o an etchant may be used, wherein the dielectric layer 402a may be used as an etch stop for the etchant.

Optionally, the dielectric layer 402a may be removed at least under the one or more openings 404o, and further optionally under at least the central region 404c of the second layer 404 as illustrated in FIG. 17B, e.g. at least under the opening 402o. The one or more openings 404o may be connected with the opening 204o. The opening 402o may be connected with the opening 204o.

FIG. 18A, FIG. 18B and FIG. 18C respectively show a conventional microelectromechanical microphone 1800a to 1800b in a schematic cross sectional view.

A conventional capacitive silicon microphone includes a membrane 124 and one or two backplates 122 separated by a gap (see also FIG. 1A, FIG. 1B and FIG. 1C), e.g. an air-gap, and directly coupled (e.g. in physical contact) with the semiconductor carrier 104. For most concepts, the membrane 124 is designed and processed having a tensile stress to counterbalance the attractive electrostatic force between membrane 124 and the one or two backplates 122. To reach high sensitivity and high SNR (signal to noise ratios) the membrane 124 is designed and processed to end up with low stress.

External stress 111 due to process variations, thermal expansion of different materials, the materials and the assembly process of the package induce inevitable additional stress into the supporting structure 102, 104 and the membrane 124 and the one or two backplates 122. This additional stress will change the balancing of the membrane 124, changing the sensitivity and all other acoustical parameters of the microphone, leading to failure in specified parameters.

Therefore, the conventional microelectromechanical microphones 1800a to 1800b are limited in their usable membrane stress and therefore signal levels, in their reachable SNR, in their yield losses in fabrication of the device due to specified parameters, in their noise cancellation due to performance shifts of single systems. The conventional microelectromechanical microphones 1800a to 1800b may also lead to field failures due to pressure and/or drop events, e.g. if the membrane brakes.

Figure 19A:
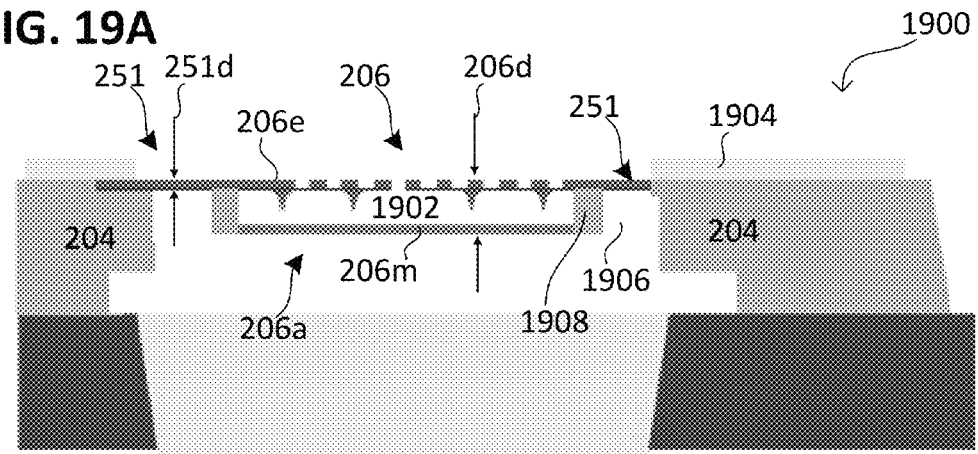
FIG. 19A, FIG. 19B and FIG. 19C respectively show a microelectromechanical device according to various embodiments in a schematic cross sectional view.
Figure 19B:
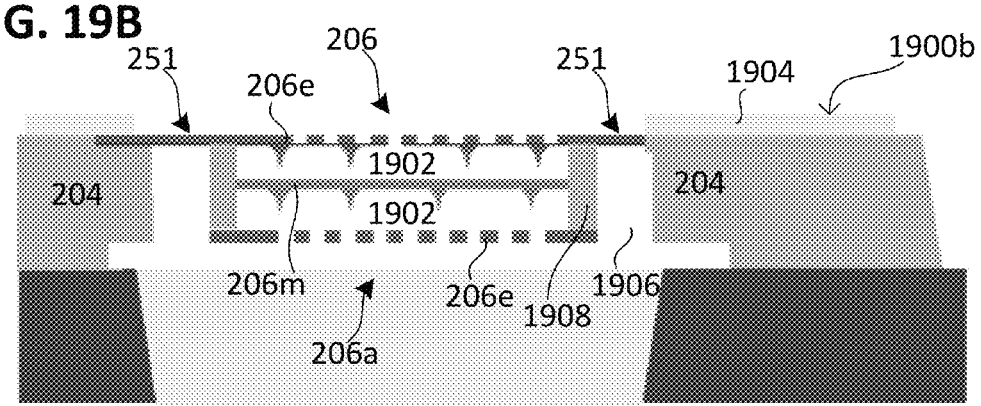
Figure 19C:
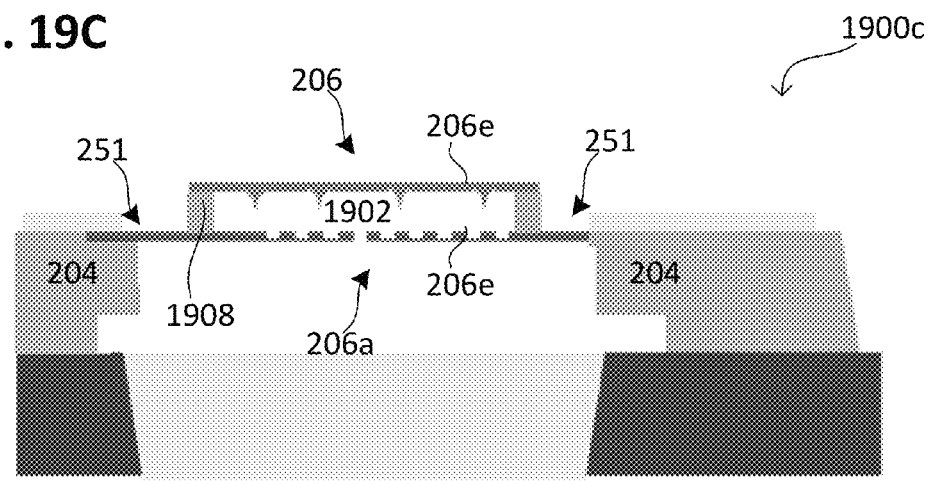

FIG. 19A, FIG. 19B and FIG. 19C respectively show a microelectromechanical device 1900a to 1900b according to various embodiments in a schematic cross sectional view.

Each microelectromechanical device 1900a to 1900b may include a semiconductor carrier 204, a microelectromechanical element 206 and a connection structure 251 which extends from the semiconductor carrier 204 to the microelectromechanical element 206 and mechanically couples (e.g. elastically couples) the microelectromechanical element 206 with the semiconductor carrier 204. For example, the microelectromechanical element 206 may be resiliently supported to the semiconductor carrier 204 via the connection structure 251.

According to various embodiments, a thickness 251d of the connection structure 251 may be smaller than a thickness 206d of the microelectromechanical element 206. According to various embodiments, thickness 251d of the connection structure 251 may be smaller than about 75% of the thickness 251d of the connection structure 251, e.g. smaller than about 50% of the thickness 251d of the connection structure 251, e.g. smaller than about 25% of the thickness 251d of the connection structure 251, e.g. smaller than about 10% of the thickness 251d of the connection structure 251.

The microelectromechanical element 206 may include a mechanical member 206m and one or more electrical members 206e (in other words, at least one electrical member). The one or more electrical members 206e may each be perforated. The mechanical member 206m may be separated from each of the one or more electrical members 206e by one or more hollows 1902.

Each microelectromechanical device 1900a to 1900b may include an electrical connection structure 1904 (including or formed from one or more electrical conducting tracks) which connects the at least one contact pad with the microelectromechanical element 206. The connection structure 251 may at least one of: be electrically conductive or include one or more electrically conductive regions (e.g. formed from one or more electrically conductive layers) for electrically connecting the connection structure 1904 with the microelectromechanical element 206. For example, the connection structure 251 may include or be formed from one or more electrically conductive layers (e.g. a metallization) electrically connecting the microelectromechanical element 206 with the at least one contact pad.

The electrical members 206e may be disposed under the one or more electrical members 206e, as illustrated in FIG. 19A. The electrical members 206e may be disposed between the one or more electrical members 206e, as illustrated in FIG. 19B. The electrical members 206e may be disposed over the one or more electrical members 206e, as illustrated in FIG. 19C.

Optionally, each microelectromechanical device 1900a to 1900b may include a hollow casing 1908 surrounding the one or more hollows 1902. For example, the mechanical member 206m and the one or more electrical members 206e may be coupled by the hollow casing 1908. The hollow casing 1908 may be formed ring shaped. The hollow casing 1908 may be disposed distant to the semiconductor carrier 204. The mechanical member 206m may be disposed distant to the semiconductor carrier 204. The mechanical member 206m may be coupled the one or more electrical members 206e. The hollow casing 1908 may be formed in a coupling region of the microelectromechanical device. The coupling region may be understood as the region in which the mechanical member 206m and the one or more electrical members 206e are coupled with each other.

For providing the mechanical member 206m coupled distant to the semiconductor carrier 204, an opening 1906 may be formed at least under the peripheral region of the connection structure 251, under the peripheral region of the first layer, e.g. if the connection structure 251 is formed from the first layer. Forming the opening 1906 may include forming the opening 1906 distant to the mechanical member 206m, e.g. distant to the second layer, e.g. if the mechanical member 206m is formed from the second layer.

The opening 1906 may surround at least one of: the mechanical member 206m, the hollow casing 1908 (if present), the one or more hollow 1902.

As illustrated in FIG. 19C, the hollow casing 1908 may be formed over the one or more electrical members 206e.

At least one of the one or more electrical members 206e and the connection structure 251 may be formed from one layer, e.g. the first layer.

Figure 20A:
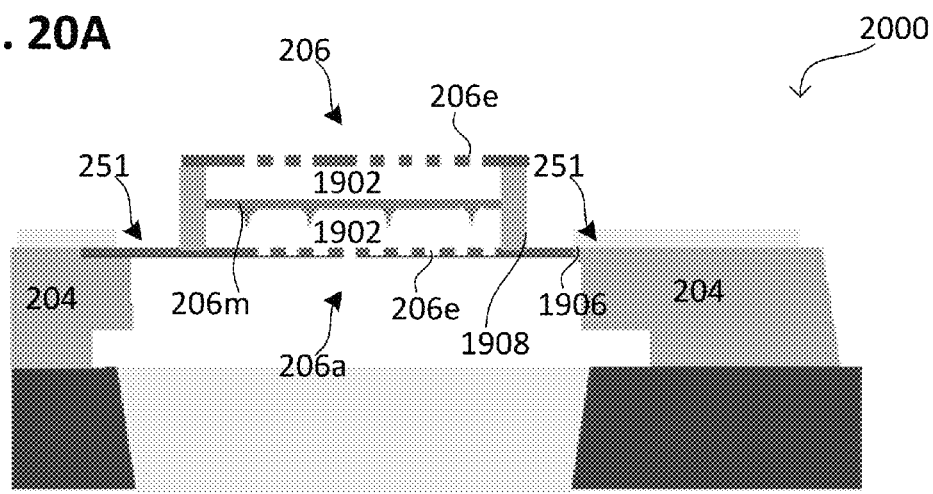
FIG. 20A and FIG. 20B respectively show a microelectromechanical device according to various embodiments in a schematic cross sectional view.

FIG. 20A shows a microelectromechanical device 2000a according to various embodiments in a schematic cross sectional view. The microelectromechanical device 2000a may be similar to the microelectromechanical device 1900c, wherein the mechanical member 206m may be disposed between two one or more electrical members 206e. At least one on the two electrical members 206e and the connection structure 251 may be formed from one layer, e.g. the first layer. The two electrical members 206e may include a first electrical member 206e and a second electrical member 206e, wherein the first electrical member 206e may be disposed proximate the connection structure 251 and the second electrical member 206e may be disposed distant from the connection structure 251.

The connection structure 251 may include or be formed from an unopened layer, e.g. the first layer. Alternatively, the connection structure 251 may include or be formed from an opened layer, e.g. the first layer. For example, the connection structure 251 may be formed disc like. Opening the connection structure 251 may reduce a cross sectional area of the connection structure (perpendicular to the microelectromechanical element 206) filled by a solid material. Therefore, the cross sectional area of the connection structure filled by a solid material may be smaller than a cross sectional area of the microelectromechanical element filled by a solid material.

According to various embodiments, the mechanical member 206m (e.g. a membrane), and optionally at least one of the one or more electrical member 206e (e.g. the second electrical member 206e (e.g. the second backplate) in case of a dual backplate system, may be attached to the first electrical member 206e, e.g. via the hollow casing 1908. For example, the mechanical member 206m and the second electrical member 206e might be attached on top of the first electrical member 206e (as illustrated in FIG. 19C) or below (as illustrated in FIG. 20A).

Figure 20B:
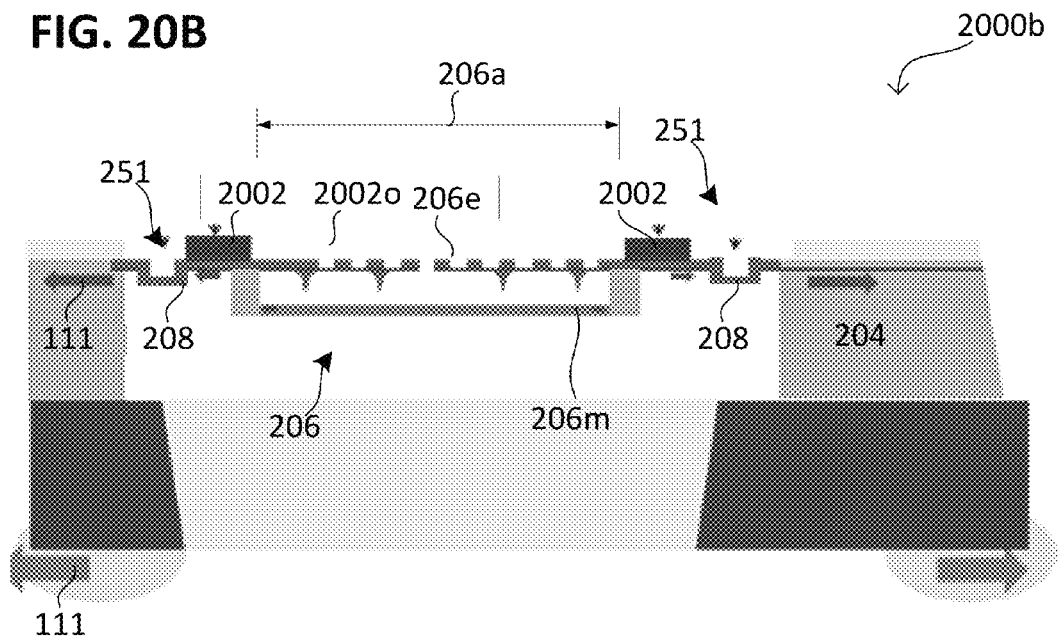

FIG. 20B shows a microelectromechanical device 2000b according to various embodiments in a schematic cross sectional view. As described before, the connection structure 251 may include or be formed from one or more spring arms 208.

Optionally, the microelectromechanical device 2000b may include a stiffening element 2002. Similar, any of the previously described microelectromechanical device according to various embodiments, may include a stiffening element 2002. The stiffening element 2002 may include an opening 206 exposing at least one of: the mechanical member 206m, one or more electrical members 206e. In other words, the opening 206 formed in the stiffening element 2002 may expose an active region 206a of the microelectromechanical element 206. The stiffening element 2002 may be configured for at least partially absorbing torsion of the microelectromechanical element.

The active region 206a may be configured to generate or modify an electrical signal in response to a mechanical signal and/or is configured to generate or modify a mechanical signal in response to an electrical signal. The active region 206a may be defined by the extension of at least one of: the mechanical member 206m, the one or more electrical members 206e. Illustratively, the active region 206a may be configured to transfer electrical energy in mechanical energy or vice versa.

The stiffening element 2002 may be formed ring-shaped. A stiffness (at least one of vertically or laterally) of the stiffening element 2002 may be greater than at least one of: a stiffness (at least one of vertically or laterally) of the connection structure 251, a stiffness (at least one of vertically or laterally) of the microelectromechanical element 206, a stiffness (at least one of vertically or laterally) of the hollow casing 1908. Further, the stiffness (at least one of vertically or laterally) of the semiconductor carrier 204 may be smaller than the stiffness (at least one of vertically or laterally) of the microelectromechanical element 206. The stiffening element 2002 may be coupled (e.g. in physical contact) to at least one of: a perimeter of the one or more electrical members 206e, the hollow casing 1908.

Due to connection structure 251 external stress, which arises from the package (e.g. the semiconductor carrier 204), is reduced in its transfer to the mechanical member 206m. Alternatively or additionally, the stiffening element 2002 (e.g. a stabilization ring), which may be disposed on the one or more electrical members 206e (e.g. the first electrical members 206e) may stiffen the support for the mechanical member 206m, e.g. the hollow casing 1908. Therefore, further the external stress may be reduced. The connection structure 251 may include a stress-decoupling element (e.g. the one or more spring arms 208) which may further decrease the induced stress. In other words, the connection structure 251 may be configured for at least partially absorbing mechanical load (e.g. stress) from the semiconductor carrier 204.

FIG. 21A shows a conventional microelectromechanical device 2100a in a schematic cross sectional view. Due to the conventional support of the membrane 124 at least one of at or in the semiconductor carrier 104, stress from the membrane 124 is transferred into the semiconductor carrier 104 and vice versa. Especially for thin a membrane 124, the stress may concentrate in the region where the membrane 124 is supported (e.g. attached) at least one of at or in the semiconductor carrier 104, leading to high stress concentrations.

FIG. 21B shows a microelectromechanical device 2100b according to various embodiments in a schematic cross sectional view. Due to the changed geometry regarding conventional microelectromechanical devices 2100a, the stress may be distributed to a greater region in the semiconductor carrier 204, and therefore may be reduced in its concentration. This may reduce the mechanical load transferred to the microelectromechanical element 206, e.g. at least one of: the mechanical member 206m, the one or more electrical members 206e.

According to various embodiments, a higher mechanical stability regarding pressure bursts and in the case of a drop may be provided. This may avoid that, since the mechanical member 206m may be formed as thin layer, the pressure causes a stress peak in the region, where the membrane is attached to the connection structure 251. According to various embodiments, the stress peaks are distributed to at least one of: the mechanical member 206m, the connection structure 251 (e.g. a backplate support), a rim of the whole side layers. This distribution of the stress may lead to a reduction in the stress concentration peaks, increasing the robustness of at least one of: the microelectromechanical element 106, the mechanical member 206m.

Figure 22A:
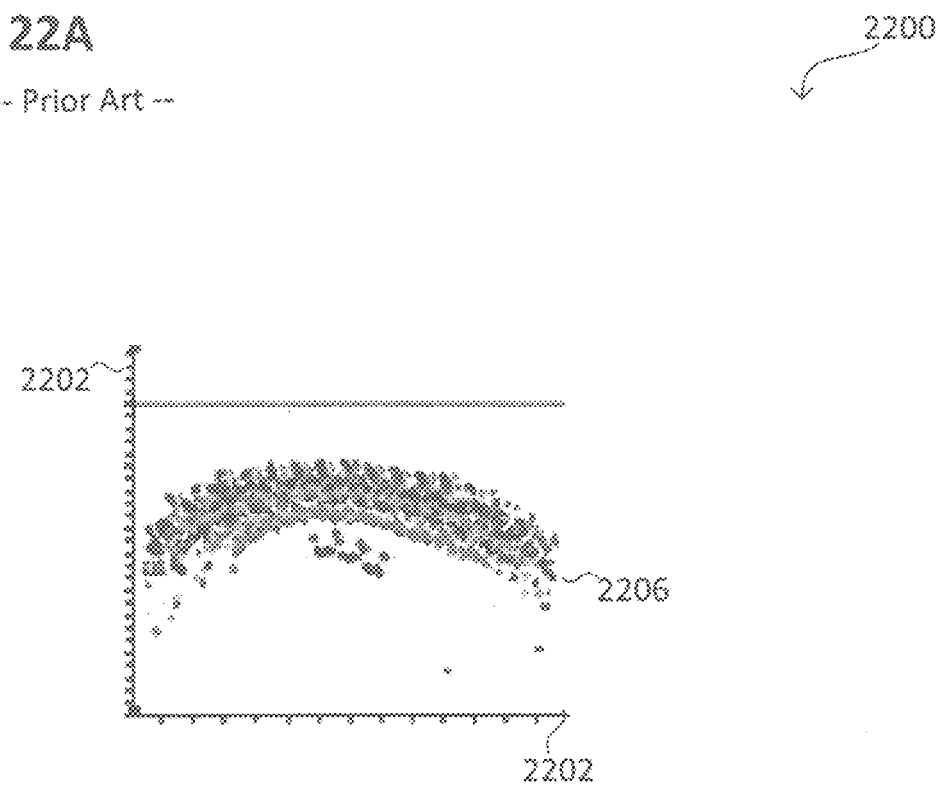
FIG. 22A shows a line scan of a conventional microelectromechanical device.

FIG. 22A illustrates a line scan of a conventional microelectromechanical device, wherein in the diagram the capacitance 2204 is shown over the frequency 2202. The measurement data where acquired from identically fabricated conventional microelectromechanical devices. As illustrated, the characteristics 2206 are distributed over a large parameter range and exhibit a strong deviation from linear behavior with increasing frequency.

Figure 22B:
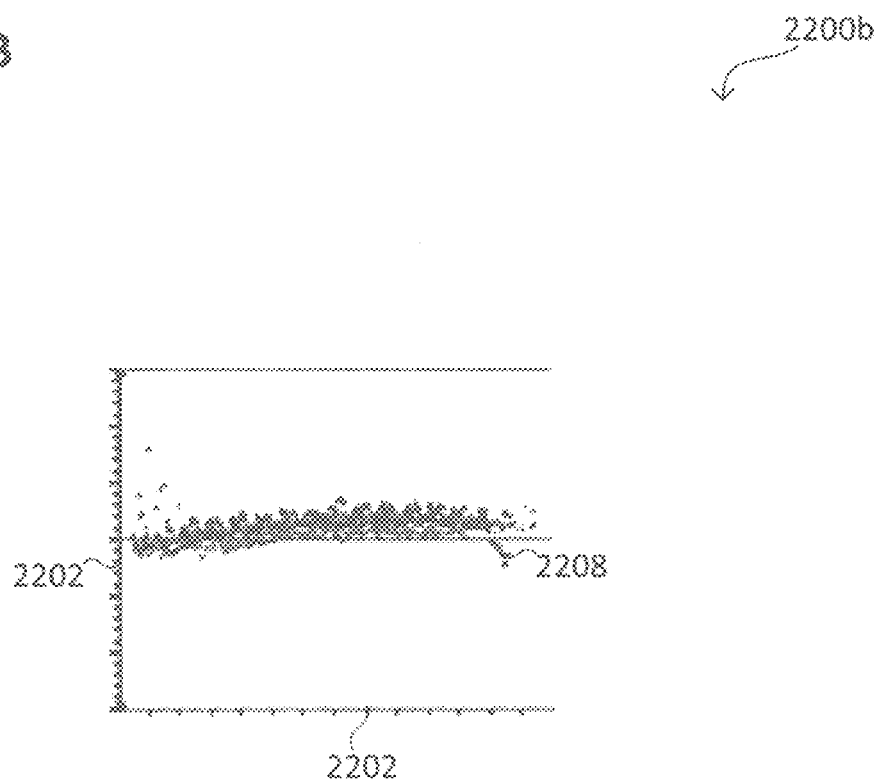
FIG. 22B shows a line scan of a microelectromechanical device according to various embodiments in a schematic cross.

FIG. 22B illustrates a line scan of a microelectromechanical device according to various embodiments. The measurement data where acquired from identically fabricated microelectromechanical devices according to various embodiments. As illustrated, the characteristics 2206 are distributed over a narrow parameter range and exhibit a small deviation from linear behavior with increasing frequency. In other words, the microelectromechanical devices according to various embodiments, exhibit at least one of: a significant higher stability and reduced variations.

Further, preferred embodiments will be described in the following:

1. A microelectromechanical device may include:
   a semiconductor carrier;
   a microelectromechanical element disposed in a position distant to the semiconductor carrier (e.g. such that a gap is formed between the microelectromechanical element and the semiconductor carrier);
   wherein the microelectromechanical element is configured to generate or modify an electrical signal in response to a mechanical signal and/or is configured to generate or modify a mechanical signal in response to an electrical signal;
   at least one contact pad, which is electrically connected to the microelectromechanical element for transferring the electrical signal between the contact pad and the microelectromechanical element; and
   one or more spring arms which extend from the semiconductor carrier to the microelectromechanical element and elastically couple the microelectromechanical element with the semiconductor carrier.

2. The microelectromechanical device of clause 1,
wherein the one or more spring arms are configured to deflect in response to a mechanical load, such that the mechanical load is at least partially (e.g. elastically) absorbed by the one or more spring arms.

3. The microelectromechanical device of clause 1 or 2,
wherein the one or more spring arms include at least one of: a non-polymer and an inorganic material.

4. The microelectromechanical device of clause 3,
wherein at least one of the non-polymer material or the inorganic material includes a metallic material, a ceramic material and/or a semiconducting material.

5. The microelectromechanical device of clause 3 or 4,
wherein at least one of the non-polymer material and the inorganic material include at least one of a crystalline material, a polycrystalline material and nanocrystalline material.

6. The microelectromechanical device of one of the clauses 1 to 5,
wherein the mechanical signal includes at least one of the following group of signals: sonic signal, a pressure signal; a vibration signal, an oscillation signal, an impulse signal, an acoustic signal.

7. The microelectromechanical device of one of the clauses 1 to 6,
wherein the microelectromechanical element includes a mechanical member and an electrical member, wherein the electrical member is configured to move the mechanical member based on the electrical signal for generating or modifying the mechanical signal and/or wherein the electrical element is configured to sense a movement of the mechanical member and to generate or modify the electrical signal based on the movement.

8. The microelectromechanical device of one of the clauses 7,
wherein the electrical member is configured to generate or modify a force for moving the mechanical member, wherein the force is generated based on the electrical signal, and/or wherein the electrical member is configured to sense a force generated by the mechanical member and to generate or modify an electrical signal based on the force.

9. The microelectromechanical device of one of the clauses 1 to 8,
wherein the microelectromechanical element includes a mechanical member in form of a membrane and wherein the microelectromechanical element is configured to generate the electrical signal in response to an oscillation of the membrane and/or to generate an oscillation of the membrane in response to an electrical signal.

10. The microelectromechanical device of one of the clauses 1 to 9,
wherein a gap extends between the semiconductor carrier and the microelectromechanical element, wherein the gap extends at least substantially around the microelectromechanical element.

11. The microelectromechanical device of one of the clauses 1 to 10,
wherein the one or more spring arms are in (e.g. physical) contact with a peripheral region of the microelectromechanical element and/or wherein the one or more spring arms are in (e.g. physical) contact with the semiconductor carrier.

12. The microelectromechanical device of one of the clauses 1 to 11,
wherein at least one spring arm of the one or more spring arms is meander shaped.

13. The microelectromechanical device of one of the clauses 1 to 12,
wherein at least one spring arm of the one or more spring arms is corrugated.

14. The microelectromechanical device of one of the clauses 1 to 13,
wherein the microelectromechanical element is electrically insulated from the semiconductor carrier.

15. The microelectromechanical device of one of the clauses 1 to 14,
wherein the semiconductor carrier includes an opening, wherein the microelectromechanical element is disposed at least one of in or over the opening.

16. The microelectromechanical device of one of the clauses 1 to 15,
an electrical circuit which is electrically coupled to the at least one contact pad for transmitting the electrical signal, wherein the electrical circuit is configured to generate or modify electrical signals for driving the microelectromechanical element and/or wherein the electrical circuit is configured to process electrical signals generated or modified by the microelectromechanical element.

17. The microelectromechanical device of clause 16,
wherein the electrical circuit includes a data converter which includes a data input/output interface, wherein the data converter is configured to convert data received at the input/output interface into an electrical signal and/or wherein the data converter is configured to convert an electrical signal into data which is supported to the input/output interface.

18. The microelectromechanical device of clause 16,
wherein the electrical circuit includes an analog/digital converter which includes a data input/output interface, wherein the analog/digital converter is configured to convert a digital signal received at the input/output interface into an electrical signal and/or wherein the analog/digital converter is configured to convert an electrical signal into a digital signal which is supported to the input/output interface.

19. The microelectromechanical device of one of the clauses 1 to 18,
wherein the one or more spring arms define a mean position of the microelectromechanical element relative to the semiconductor carrier, wherein the one or more spring arms are configured to generate a spring force pointing to the mean position in response to a displacement of the microelectromechanical element from the mean position.

20. The microelectromechanical device of one of the clauses 1 to 19,
wherein the one or more spring arms includes at least two spring arms.

21. The microelectromechanical device of clause 20,
wherein the at least two spring arms are disposed on opposite sides of the microelectromechanical element.

22. A method for forming a microelectromechanical device, the method may include:
forming a microelectromechanical element in a position distant to a semiconductor carrier;
forming a contact pad which is electrically connected to the microelectromechanical element; and
forming one or more spring arms extending between the semiconductor carrier and the microelectromechanical element for elastic coupling the microelectromechanical element with the semiconductor carrier.

23. A method for forming a microelectromechanical device, the method may include:
forming a first layer at least one of in or over a semiconductor carrier;
forming a second layer at least one of in or over at least a central region of the first layer, such that a peripheral region of the first layer is at least partially free of the second layer;
structuring the peripheral region of the first layer to form one or more spring arms;
removing material under at least a central region of the second layer to release (in other words, disengage) the central region of the second layer; and/or
removing material under at least the peripheral region of the first layer to release the one or more spring arms.

24. The method of clause 23,
wherein removing material under at least the central region of the second layer includes:
removing at least material of the semiconductor carrier; and/or
removing at least material of the first layer, wherein the first layer at least partially remains under a peripheral region of the second layer.

25. The method of clause 23 or 24,
wherein removing material under at least the central region of the second layer includes exposing at least the central region of the second layer.

26. The method of one of the clauses 23 to 25,
wherein removing material under at least the peripheral region of the first layer includes removing at least material of the semiconductor carrier.

27. The method of one of the clauses 23 to 26,
wherein removing material under at least the peripheral region of the first layer includes exposing at least the peripheral region of the first layer.

28. The method of one of the clauses 23 to 27, further including:
forming a trench and/or a recess in the semiconductor carrier, wherein forming the first layer includes forming the first layer at least partially in or over the trench and/or recess.

29. The method of clause 28, further including:
forming an insulation layer in the trench and/or the recess, the insulation layer lining the trench and/or the recess at least partially (e.g. partially or completely).

30. The method of one of the clauses 23 to 29, further including:
removing material of the first layer to flatten the first layer before the second layer is formed.

31. The method of clause 30,
wherein removing material of the first layer includes forming a flat central region of the first layer.

32. The method of one of the clauses 23 to 31,
wherein structuring the peripheral of the first layer includes removing material at least partially from the peripheral portion of the first layer.

33. The method of one of the clauses 23 to 32,
wherein structuring the peripheral region of the first layer includes forming one or more trenches in the semiconductor carrier, wherein the first layer is at least partially disposed at least one of in or over the one or more trenches and removing material of the first layer outside the one or more trenches.

34. The method of one of the clauses 23 to 33,
wherein structuring the peripheral region of the first layer includes corrugating the peripheral region of the first layer at least partially.

35. The method of one of the clauses 23 to 34,
wherein removing material under at least the central region of the second layer includes forming an opening under the second layer.

36. The method of one of the clauses 23 to 35, further including:
forming an electrically conductive layer which includes at least one contact pad and at least one electrical member (e.g. one electrical tracks or wire) for coupling (e.g. electrically connecting, inductively coupling, capacitively coupling, etc.) the second layer with the at least one contact pad.

37. The method of one of the clauses 23 to 36,
wherein removing material under at least a central region of the second layer includes:
etching the semiconductor carrier with a first etchant; and/or
etching the first layer with a second etchant.

38. The method of one of the clauses 23 to 37, further including:
forming a first insulation layer between the first layer and the semiconductor carrier.

39. The method of one of the clauses 23 to 37, further including:
forming a first insulation layer between the first layer and the semiconductor carrier;
wherein removing material under at least a central region of the second layer includes:
etching the semiconductor carrier with a first etchant; and/or
etching the first layer with a second etchant;
wherein the first insulation layer is used as an etch stop for the first etchant.

40. The method of clause 38 or 39,
wherein removing material under at least a central region of the second layer includes removing the first insulation layer at least partially to expose the first layer.

41. The method of one of the clauses 23 to 40, further including:
forming a second insulation layer between the first layer and the second layer.

42. The method of one of the clauses 23 to 40, further including:
forming a second insulation layer between the first layer and the second layer;
wherein removing material under at least a central region of the second layer includes:
etching the semiconductor carrier with a first etchant; and/or
etching the first layer with a second etchant;
wherein the second insulation layer is used as an etch stop for the second etchant.

43. The method of clause 41 or 42,
wherein removing material under at least a central region of the second layer includes removing the second insulation layer at least partially to expose the second layer.

44. The method of one of the clauses 41 to 43, further including:
forming a first insulation layer between the first layer and the semiconductor carrier and optionally removing material from the first insulation layer to expose the first layer (e.g. the backside of the first layer may be exposed); and/or forming a second insulation layer between the first layer and the second layer and optionally removing material from the second insulation layer to expose the second layer (e.g. the backside of the second layer may be exposed).

45. A microelectromechanical device including:

a semiconductor carrier;

a microelectromechanical element disposed in a position distant to the semiconductor carrier;

wherein the microelectromechanical element is configured to generate or modify an electrical signal in response to a mechanical signal and/or is configured to generate or modify a mechanical signal in response to an electrical signal;

at least one contact pad, which is electrically connected to the microelectromechanical element for transferring the electrical signal between the contact pad and the microelectromechanical element; and a connection structure which extends from the semiconductor carrier to the microelectromechanical element and mechanically couples the microelectromechanical element with the semiconductor carrier.

46. The microelectromechanical device of clause 45, wherein the connection structure is configured for absorbing mechanical load from the semiconductor carrier by the connection structure at least partially.

47. The microelectromechanical device of clause 45 or 46, wherein a thickness of the connection structure is smaller than a thickness of at least one of the microelectromechanical element and the semiconductor carrier.

48. The microelectromechanical device of one of the clauses 45 to 47, wherein a cross sectional area of the connection structure is smaller than a cross sectional area of the microelectromechanical element.

49. The microelectromechanical device of one of the clauses 45 to 48, wherein a cross sectional area of the connection structure is smaller than a cross sectional area of the microelectromechanical element.

50. The microelectromechanical device of one of the clauses 45 to 49, wherein a stiffness of the connection structure is smaller than at least one of: a stiffness of the microelectromechanical element or a stiffness of the semiconductor carrier; and/or wherein along a first direction (and/or a third direction) a stiffness of the connection structure is less than a stiffness of at least one of: the microelectromechanical element and the semiconductor carrier, wherein along a second direction a stiffness of the connection structure is more than a stiffness of at least one of: the microelectromechanical element, a membrane of the microelectromechanical element and the connection structure along the first direction, and wherein the first direction (and/or the third direction) is perpendicular to the second direction.

51. The microelectromechanical device of one of the clauses 45 to 50, wherein a cross sectional area of the connection structure filled by a solid material is smaller than a cross sectional area of the microelectromechanical element filled by a solid material.

52. The microelectromechanical device of one of the clauses 45 to 51, wherein the microelectromechanical element includes a mechanical member and one or more electrical members, which are mechanically coupled with each other and with the connection structure (e.g. in a coupling region distant to the semiconductor carrier).

53. The microelectromechanical device of one of the clauses 45 to 50, wherein at least one of the mechanical member and one electrical member (also referred as to second electrical member) of the one or more electrical members is disposed distant from the semiconductor carrier.

54. The microelectromechanical device of clause 53, wherein the mechanical member is perforated.

55. The microelectromechanical device of clause 53 or 54, wherein at least one first electrical member of the one or more electrical members and the connection structure are formed from one layer, wherein the mechanical member is coupled to the layer in between the first electrical member and the connection structure.

56. The microelectromechanical device of one of the clauses 53 to 55, wherein the one or more electrical members are configured to move the mechanical member based on the electrical signal for generating or modifying the mechanical signal and/or wherein the electrical element is configured to sense a movement of the mechanical member and to generate or modify the electrical signal based on the movement.

57. The microelectromechanical device of one of the clauses 45 to 56, wherein the microelectromechanical element includes a mechanical member in form of a membrane and wherein the microelectromechanical element is configured to generate the electrical signal in response to an oscillation of the membrane and/or to generate an oscillation of the membrane in response to an electrical signal.

58. The microelectromechanical device of one of the clauses 45 to 57, further including:

a stiffening element at least partially surrounding the microelectromechanical element and being distant from the semiconductor carrier.

59. The microelectromechanical device of clauses 58, wherein the stiffening element is configured for at least partially absorbing torsion of the microelectromechanical element.

60. The microelectromechanical device of clause 58 or 59, wherein the stiffening element is mechanically coupled to the microelectromechanical element.

61. The microelectromechanical device of one of the clauses 45 to 60, wherein the connection structure includes one or more electrically conductive layers for electrically connecting the microelectromechanical element with the at least one contact pad.

62. The microelectromechanical device of one of the clauses 45 to 61, wherein a gap extends between the semiconductor carrier and the microelectromechanical element at least substantially around the microelectromechanical element, wherein the connection structure extends through the gap.

63. The microelectromechanical device of one of the clauses 45 to 62, wherein the microelectromechanical element is electrically insulated from the semiconductor carrier.

64. The microelectromechanical device of one of the clauses 45 to 63,
wherein the semiconductor carrier includes an opening, wherein the microelectromechanical element is disposed at least one of in or over the opening, wherein optionally an extension of the opening parallel to a surface of the semiconductor carrier is greater than an extension of the microelectromechanical element parallel to the surface of the semiconductor carrier.

65. The microelectromechanical device of one of the clauses 45 to 64,
an electrical circuit which is electrically coupled to the at least one contact pad for transmitting the electrical signal, wherein the electrical circuit is configured to generate or modify electrical signals for driving the microelectromechanical element and/or wherein the electrical circuit is configured to process electrical signals generated or modified by the microelectromechanical element.

66. The microelectromechanical device of clause 65,
wherein the electrical circuit includes a data converter which includes a data input/output interface, wherein the data converter is configured to convert data received at the input/output interface into an electrical signal and/or wherein the data converter is configured to convert an electrical signal into data which is supported to the input/output interface.

67. The microelectromechanical device of clause 65,
wherein the electrical circuit includes an analog/digital converter which includes a data input/output interface, wherein the analog/digital converter is configured to convert a digital signal received at the input/output interface into an electrical signal and/or wherein the analog/digital converter is configured to convert an electrical signal into a digital signal which is supported to the input/output interface.

68. The microelectromechanical device of one of the clauses 45 to 67,
wherein the connection structure defines a mean position of the microelectromechanical element relative to the semiconductor carrier, wherein the connection structure is configured to generate a spring force pointing to the mean position in response to a displacement of the microelectromechanical element from the mean position.

69. The microelectromechanical device of one of the clauses 45 to 68,
wherein the connection structure is in physical contact with at least one of: a peripheral region of the microelectromechanical element, the semiconductor carrier.

70. The microelectromechanical device of one of the clauses 45 to 69,
wherein the connection structure includes one or more openings extending through the connection structure.

71. The microelectromechanical device of one of the clauses 45 to 70,
wherein the connection structure includes one or more spring arms, which extend from the semiconductor carrier to the microelectromechanical element and elastically couple the microelectromechanical element with the semiconductor carrier.

72. The microelectromechanical device of clause 71,
wherein the one or more spring arms are configured to deflect in response to a mechanical load, such that the mechanical load is at least partially absorbed by the one or more spring arms.

73. The microelectromechanical device of clause 68 or 72,
wherein at least one spring arm of the one or more spring arms is meander shaped.

74 The microelectromechanical device of one of the clauses 68 to 73,
wherein at least one spring arm of the one or more spring arms is corrugated.

75. The microelectromechanical device of one of the clauses 68 to 74,
wherein the one or more spring arms include at least two spring arms.

76. The microelectromechanical device of one of the clauses 68 to 75,
wherein the at least two spring arms are:
disposed on opposite sides of the microelectromechanical element and/or are in physical contact with a peripheral region of the microelectromechanical element.

77. The microelectromechanical device of one of the clauses 45 to 76,
wherein at least one of the connection structure and the at least two spring arms include at least one of a non-polymer or an inorganic material.

78. The microelectromechanical device of one of the clauses 45 to 77,
wherein a gap extends between the semiconductor carrier and the microelectromechanical element, wherein the gap extends at least substantially around the microelectromechanical element.

79. The microelectromechanical device of clause 77,
wherein at least one of the non-polymer material and the inorganic material includes a metallic material, a ceramic material and/or a semiconducting material.

80. The microelectromechanical device of clause 77 or 79,
wherein at least one of the non-polymer material and the inorganic material include a crystalline, polycrystalline and/or nanocrystalline material.

81. The microelectromechanical device of one of the clauses 45 to 80,
wherein the mechanical signal includes at least one of the following group of signals: sonic signal, a pressure signal; a vibration signal, an oscillation signal, an impulse signal, an acoustic signal.

82. The microelectromechanical device of one of the clauses 45 to 81,
wherein the microelectromechanical element includes a mechanical member and an electrical member, wherein the electrical member is configured to move the mechanical member based on the electrical signal for generating or modifying the mechanical signal and/or wherein the electrical element is configured to sense a movement of the mechanical member and to generate or modify the electrical signal based on the movement.

83. The microelectromechanical device of one of the clauses 82,
wherein the electrical member is configured to generate or modify a force for moving the mechanical member, wherein the force is generated based on the electrical signal, and/or wherein the electrical member is configured to sense a force generated by the mechanical member and to generate or modify an electrical signal based on the force.

84. The microelectromechanical device of one of the clauses 45 to 83,
wherein the microelectromechanical element is supported by the semiconductor carrier via the connection structure.

85. The microelectromechanical device of one of the clauses 45 to 84,
wherein the microelectromechanical element is resiliently supported by the semiconductor carrier via the connection structure.

86. A method for forming a microelectromechanical device, the method including:
forming a microelectromechanical element in a position distant to a semiconductor carrier;
forming a contact pad which is electrically connected to the microelectromechanical element;
forming connection structure which extends from the semiconductor carrier to the microelectromechanical element and mechanically couples the microelectromechanical element with the semiconductor carrier.

87. A method for forming a microelectromechanical device, the method including:
forming a first layer at least one of in or over a semiconductor carrier;
forming a second layer at least one of under or over at least a central region of the first layer, such that a peripheral region of the first layer is at least partially free of the second layer; and
at least one of the following:
removing material under at least a central region of the second layer to release at least one of the central region of the second layer or a central region of the first layer;
removing material under at least the peripheral region of the first layer to release at least one of the second layer or the peripheral region of the first layer; or
removing material under at least the peripheral region of the first layer to such that the second layer is supported by the semiconductor carrier via the first layer.

88. The method of clause 87, further including:
structuring the peripheral region of the first layer to form one or more openings extending through the peripheral region of the first layer.

89. The method of clause 87 or 88, further including:
structuring the peripheral region of the first layer to form one or more spring arms, wherein removing material under at least the peripheral region of the first layer includes releasing the one or more spring arms.

90. The method of one of the clauses 87 to 89, further including:
forming a hollow between the first layer and the second layer.

91. The method of one of the clauses 87 to 90, further including:
forming a third layer at least one of under or over the first layer between the peripheral region of the first layer and the central region of the first layer for providing a stiffening element, such that the peripheral region of the first layer and the central region of the first layer are at least partially free of the third layer.

92. The method of one of the clauses 87 to 91,
wherein removing material under at least the central region of the second layer includes at least one of:

removing at least material of the semiconductor carrier;
forming a hollow between the first layer and the second layer; or
removing at least material of the first layer, wherein the first layer at least partially remains coupled to a peripheral region of the second layer.

93. The method of clause 92,
wherein the first layer at least partially remains under the peripheral region of the second layer.

94. The method of one of the clauses 87 to 93, further including:
forming trenches in the peripheral region of the first layer extending through the first layer.

95. The method of one of the clauses 87 to 94, further including:
perforating the first layer at least in its central region.

96. The method of one of the clauses 87 to 95,
wherein removing material under at least the central region of the second layer includes forming an opening under the second layer.

97. The method of one of the clauses 87 to 96, further including:
forming an electrically conductive layer which includes at least one contact pad and one or more electrical members for coupling the second layer with the at least one contact pad.

98. The method of one of the clauses 87 to 97,
wherein removing material under at least a central region of the second layer includes:
etching the semiconductor carrier with a first etchant; and/or etching the first layer with a second etchant.

99. The method of one of the clauses 87 to 98, further including:
forming a first insulation layer between the first layer and the semiconductor carrier.

100. The method of one of the clauses 87 to 99, further including:
forming a first insulation layer between the first layer and the semiconductor carrier;
wherein removing material under at least a central region of the second layer includes at least one of:
etching the semiconductor carrier with a first etchant; or
etching the first layer with a second etchant;
wherein the first insulation layer is used as an etch stop for the first etchant.

101. The method of clause 87 to 100,
wherein removing material under at least a central region of the second layer includes removing the first insulation layer at least partially to expose the first layer.

102. The method of one of the clauses 87 to 101, further including:
forming a second insulation layer between the first layer and the second layer;
wherein removing material under at least a central region of the second layer includes at least one of:
etching the semiconductor carrier with a first etchant; or
etching the first layer with a second etchant;
wherein the second insulation layer is used as an etch stop for the second etchant.

103. The method of clause 87 to 102,
wherein removing material under at least a central region of the second layer includes removing the second insulation layer at least partially to expose the second layer.

104. The method of one of the clauses 87 to 103, further including:
forming a first insulation layer between the first layer and the semiconductor carrier and optionally removing material from the first insulation layer to expose the first layer (e.g. the backside of the first layer may be exposed); and/or
forming a second insulation layer between the first layer and the second layer and optionally removing material from the second insulation layer to expose the second layer (e.g. the backside of the second layer may be exposed).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A microelectromechanical device comprising:
a semiconductor carrier;
a microelectromechanical element disposed in a position distant to the semiconductor carrier;
wherein the microelectromechanical element is configured to generate or modify an electrical signal in response to a mechanical signal and/or is configured to generate or modify a mechanical signal in response to an electrical signal;
at least one contact pad, which is electrically connected to the microelectromechanical element for transferring the electrical signal between the contact pad and the microelectromechanical element; and
a connection structure which extends from the semiconductor carrier to the microelectromechanical element and mechanically couples the microelectromechanical element with the semiconductor carrier;
wherein a stiffness of the connection structure is less than a stiffness of at least one of the microelectromechanical element and the semiconductor carrier;
wherein along a first direction a stiffness of the connection structure is less than a stiffness of at least one of the microelectromechanical element and the semiconductor carrier;
wherein along a second direction a stiffness of the connection structure is more than a stiffness of at least one of the microelectromechanical element and a membrane of the microelectromechanical element; and
wherein the first direction is perpendicular to the second direction.

2. The microelectromechanical device of claim 1, wherein the microelectromechanical element is resiliently supported by the semiconductor carrier via the connection structure.

3. The microelectromechanical device of claim 1, wherein a thickness of the connection structure is smaller than a thickness of at least one of the microelectromechanical element and the semiconductor carrier.

4. The microelectromechanical device of claim 1, wherein the microelectromechanical element comprises a mechanical member and one or more electrical members, which are mechanically coupled with each other and with the connection structure.

5. The microelectromechanical device of claim 4, wherein at least one of the mechanical member and one electrical member of the one or more electrical members are disposed distant from the semiconductor carrier.

6. The microelectromechanical device of claim 4, wherein the one or more electrical members are configured to move the mechanical member based on the electrical signal for generating or modifying the mechanical signal; and/or
wherein the electrical element is configured to sense a movement of the mechanical member and to generate or modify the electrical signal based on the movement.

7. The microelectromechanical device of claim 1, further comprising:
a stiffening element at least partially surrounding the microelectromechanical element and being distant from the semiconductor carrier.

8. The microelectromechanical device of claim 1, wherein a gap extends between the semiconductor carrier and the microelectromechanical element at least substantially around the microelectromechanical element, wherein the connection structure extends through the gap.

9. The microelectromechanical device of claim 1, wherein the semiconductor carrier comprises an opening, wherein the microelectromechanical element is disposed at least one of in or over the opening, wherein an extension of the opening parallel to a surface of the semiconductor carrier is greater than an extension of the microelectromechanical element parallel to the surface of the semiconductor carrier.

10. The microelectromechanical device of claim 1,
an electrical circuit which is electrically coupled to the at least one contact pad for transmitting the electrical signal, wherein the electrical circuit is configured to generate or modify electrical signals for driving the microelectromechanical element and/or wherein the electrical circuit is configured to process electrical signals generated or modified by the microelectromechanical element.

11. The microelectromechanical device of claim 10, wherein the electrical circuit includes a data converter which includes a data input/output interface, wherein the data converter is configured to convert data received at the input/output interface into an electrical signal and/or wherein the data converter is configured to convert an electrical signal into data which is supported to the input/output interface.

12. The microelectromechanical device of claim 10, wherein the electrical circuit includes an analog/digital converter which includes a data input/output interface, wherein the analog/digital converter is configured to convert a digital signal received at the input/output interface into an electrical signal and/or wherein the analog/digital converter is configured to convert an electrical signal into a digital signal which is supported to the input/output interface.

13. The microelectromechanical device of claim 1, wherein the connection structure is in physical contact with at least one of: a peripheral region of the microelectromechanical element and the semiconductor carrier.

14. The microelectromechanical device of claim 1, wherein the connection structure comprises one or more spring arms which extend from the semiconductor carrier to the microelectromechanical element and elastically couple the microelectromechanical element with the semiconductor carrier.

15. The microelectromechanical device of claim 14, wherein the one or more spring arms are configured to deflect in response to a mechanical load, such that the mechanical load is at least partially absorbed by the one or more spring arms.

16. The microelectromechanical device of claim 14, wherein at least one spring arm of the one or more spring arms is at least one of meander shaped and corrugated.

17. The microelectromechanical device of claim 14, wherein the one or more spring arms are in physical contact with a peripheral region of the microelectromechanical element.

18. The microelectromechanical device of claim 14, wherein the one or more spring arms comprise at least two spring arms.

19. The microelectromechanical device of claim 18, wherein the at least two spring arms are disposed on opposite sides of the microelectromechanical element.

20. The microelectromechanical device of claim 1, wherein the microelectromechanical element comprises a mechanical member in form of a membrane and wherein the microelectromechanical element is configured to generate the electrical signal in response to an oscillation of the membrane and/or to generate an oscillation of the membrane in response to an electrical signal.

21. The microelectromechanical device of claim 1, wherein the microelectromechanical element is electrically insulated from the semiconductor carrier.

22. The microelectromechanical device of claim 1, wherein the connection structure comprises at least one of a non-polymer or an inorganic material.

23. The microelectromechanical device of claim 1, wherein a cross sectional area of the connection structure is smaller than a cross sectional area of the micro electromechanical element.

24. The microelectromechanical device of claim 1, wherein the connection structure defines a mean position of the microelectromechanical element relative to the semiconductor carrier, wherein the connection structure is configured to generate a spring force pointing to the mean position in response to a displacement of the microelectromechanical element from the mean position.

25. The microelectromechanical device of claim 1, wherein the connection structure includes one or more openings extending through the connection structure.

26. A method for forming a microelectromechanical device, the method comprising:
forming a microelectromechanical element in a position distant to a semiconductor carrier;
forming a contact pad which is electrically connected to the microelectromechanical element;
forming a connection structure extending between the semiconductor carrier and the microelectromechanical element for mechanically coupling the microelectromechanical element with the semiconductor carrier; and
surrounding at least partially the microelectromechanical element with a stiffening element;
wherein the stiffening element is distant from the semiconductor carrier.

27. The microelectromechanical device of claim 26, wherein the connection structure comprises one or more spring arms which extend from the semiconductor carrier to the microelectromechanical element and elastically couple the microelectromechanical element with the semiconductor carrier.

28. A microelectromechanical device comprising:
a semiconductor carrier;
a microelectromechanical element disposed in a position distant to the semiconductor carrier;
wherein the microelectromechanical element is configured to generate or modify an electrical signal in response to a mechanical signal and/or is configured to generate or modify a mechanical signal in response to an electrical signal; and
wherein the microelectromechanical element comprises a mechanical member and one or more electrical members, which are mechanically coupled with each other and with the connection structure;
at least one contact pad, which is electrically connected to the microelectromechanical element for transferring the electrical signal between the contact pad and the microelectromechanical element; and
a connection structure which extends from the semiconductor carrier to the microelectromechanical element and mechanically couples the microelectromechanical element with the semiconductor carrier.

29. The microelectromechanical device of claim 28, wherein the mechanical member is perforated.

30. The microelectromechanical device of claim 28, wherein at least one first electrical member of the one or more electrical members and the connection structure are formed from one layer, wherein the mechanical member is coupled to the layer in between the first electrical member and the connection structure.

31. A microelectromechanical device comprising:
a semiconductor carrier;
a microelectromechanical element disposed in a position distant to the semiconductor carrier;
wherein the microelectromechanical element is configured to generate or modify an electrical signal in response to a mechanical signal and/or is configured to generate or modify a mechanical signal in response to an electrical signal;
at least one contact pad, which is electrically connected to the microelectromechanical element for transferring the electrical signal between the contact pad and the microelectromechanical element;
a connection structure which extends from the semiconductor carrier to the microelectromechanical element and mechanically couples the microelectromechanical element with the semiconductor carrier;
a stiffening element at least partially surrounding the microelectromechanical element and being distant from the semiconductor carrier.

32. The microelectromechanical device of claim 31, wherein the stiffening element is configured for at least partially absorbing torsion of the microelectromechanical element.

33. The microelectromechanical device of claim 31, wherein the stiffening element is mechanically coupled to the microelectromechanical element.

* * * * *